(12) United States Patent
Hase

(10) Patent No.: US 11,349,437 B2
(45) Date of Patent: May 31, 2022

(54) POWER AMPLIFIER CIRCUIT AND BIAS CONTROL CIRCUIT

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 51 days.

(21) Appl. No.: 16/864,366

(22) Filed: May 1, 2020

(65) Prior Publication Data

US 2020/0358403 A1 Nov. 12, 2020

(30) Foreign Application Priority Data

May 9, 2019 (JP) .............................. JP2019-089274

(51) Int. Cl.
*H03F 1/02* (2006.01)
*H03F 3/21* (2006.01)

(52) U.S. Cl.
CPC .......... *H03F 1/0261* (2013.01); *H03F 3/211* (2013.01); *H03F 2200/222* (2013.01); *H03F 2200/387* (2013.01); *H03F 2200/451* (2013.01); *H03F 2203/21103* (2013.01); *H03F 2203/21139* (2013.01)

(58) Field of Classification Search
CPC .. H03F 1/0261; H03F 3/211; H03F 2200/222; H03F 2200/387; H03F 2200/451; H03F 2203/21103; H03F 2203/21139
USPC ........................................................ 330/296
See application file for complete search history.

(56) References Cited

U.S. PATENT DOCUMENTS

2017/0141734 A1   5/2017   Lehtola

*Primary Examiner* — Hafizur Rahman
(74) *Attorney, Agent, or Firm* — Pearne & Gordon LLP

(57) ABSTRACT

A power amplifier circuit includes power amplifiers connected in stages to amplify a high-frequency input signal and to output an amplified high-frequency output signal, bias circuits each of which outputs a bias current to a corresponding one of the power amplifiers, and a bias control circuit configured to output a bias control current based on a second reference potential that varies in response to power of the high-frequency output signal and that is a potential of a portion in one bias circuit of the bias circuits to one or more bias circuits in a stage preceding the one bias circuit for increasing a bias current outputted from the one or more bias circuits in the stage preceding the one bias circuit.

16 Claims, 14 Drawing Sheets

POWER AMPLIFIER CIRCUIT AND BIAS CONTROL CIRCUIT

This application claims priority from Japanese Patent Application No. 2019-089274 filed on May 9, 2019. The content of this application is incorporated herein by reference in its entirety.

BACKGROUND OF THE DISCLOSURE

1. Field of the Disclosure

The present disclosure relates to a power amplifier circuit and a bias control circuit.

2. Description of the Related Art

In a power amplifier circuit, two or more power amplifiers may be connected in stages. The power amplifier in the final stage has a transistor, the size of which is larger than the size of a transistor in the power amplifiers in the previous stages, and therefore generates more heat. Therefore, when the power of a high-frequency output signal increases, the power amplifier in the final stage generates more heat, decreases a gain, and approaches a saturation state. As a result, the gain of the entire power amplifier circuit decreases.

U.S. Patent Application Publication No. 2017/0141734 describes a power amplifier circuit which increases a current flowing through a bias circuit in a preceding stage in response to a current flowing in a bias circuit in a subsequent stage. In the power amplifier circuit described in U.S. Patent Application Publication No. 2017/0141734, the current flowing through the bias circuit in the preceding stage increases in response to the increase in the current flowing through the bias circuit in the subsequent stage. As a result, the gain of the power amplifier in the preceding stage increases. The increase in the gain of the power amplifier in the preceding stage can compensate for a decrease in the gain of the power amplifier in the subsequent stage. Therefore, a decrease in the gain of the entire power amplifier circuit can be reduced.

In the power amplifier circuit described in U.S. Patent Application Publication No. 2017/0141734, a transistor 246 for detecting a current of a bias circuit 230 is disposed between the bias circuit 230 in a subsequent stage and a power supply potential Vbatt. Accordingly, the power supply potential Vbatt needs to be high in consideration of a potential drop in the transistor 246. That is, it is difficult for the power amplifier circuit described in U.S. Patent Application Publication No. 2017/0141734 to operate at a low power supply potential.

In recent years, envelope tracking control that is the control of varying a collector bias (collector potential) of a power amplifier in response to an envelope of a high-frequency signal may be performed to reduce power consumption. As described above, in the power amplifier circuit described in U.S. Patent Application Publication No. 2017/0141734, the power supply potential Vbatt is inputted to the transistor 246 for detecting the current of the bias circuit 230. Therefore, it is difficult for the power amplifier circuit described in U.S. Patent Application Publication No. 2017/0141734 to vary the current flowing through the transistor 246 in accordance with a variation in the collector potential of the power amplifier.

BRIEF SUMMARY OF THE DISCLOSURE

The present disclosure has been made in view of the above circumstances, and an object of the present disclosure is to enable the operation at a low power supply potential.

A power amplifier circuit according to an aspect of the present disclosure includes: a plurality of power amplifiers connected in a plurality of stages to amplify a high-frequency input signal and to output an amplified high-frequency output signal; a plurality of bias circuits each of which outputs a bias current to a corresponding one of the plurality of power amplifiers; and a bias control circuit configured to output a bias control current based on a second reference potential that varies in response to power of the high-frequency output signal and that is a potential of a portion in one bias circuit of the plurality of bias circuits, the bias control current being output to one or more bias circuits in a stage preceding the one bias circuit for increasing a bias current output from the one or more bias circuits in the stage preceding the one bias circuit.

A bias control circuit according to an aspect of the present disclosure is a bias control circuit configured to control a bias current of a power amplifier circuit including a plurality of power amplifiers connected in a plurality of stages to amplify a high-frequency input signal and to output an amplified high-frequency output signal and a plurality of bias circuits each of which outputs a bias current to a corresponding one of the plurality of power amplifiers. The bias control circuit is configured to output a bias control current based on a second reference potential that varies in response to power of the high-frequency output signal and that is a potential of a portion in one bias circuit of the plurality of bias circuits, the bias control current being output to one or more bias circuits in a stage preceding the one bias circuit for increasing a bias current output from the one or more bias circuits in the stage preceding the one bias circuit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, embodiments of power amplifier circuits and bias control circuits according to the present disclosure will be described in detail with reference to the drawings. It should be noted that the present disclosure is not limited to these embodiments. Each embodiment is an exemplification, and it goes without saying that the configuration illustrated in different embodiments can be partially replaced or combined. From the second embodiment onward, the description of the matters common to the first embodiment will be omitted, and only different points will be described. In particular, the same operation and effect of the same configuration will not be sequentially described for each embodiment.

First Embodiment

Figure 1:
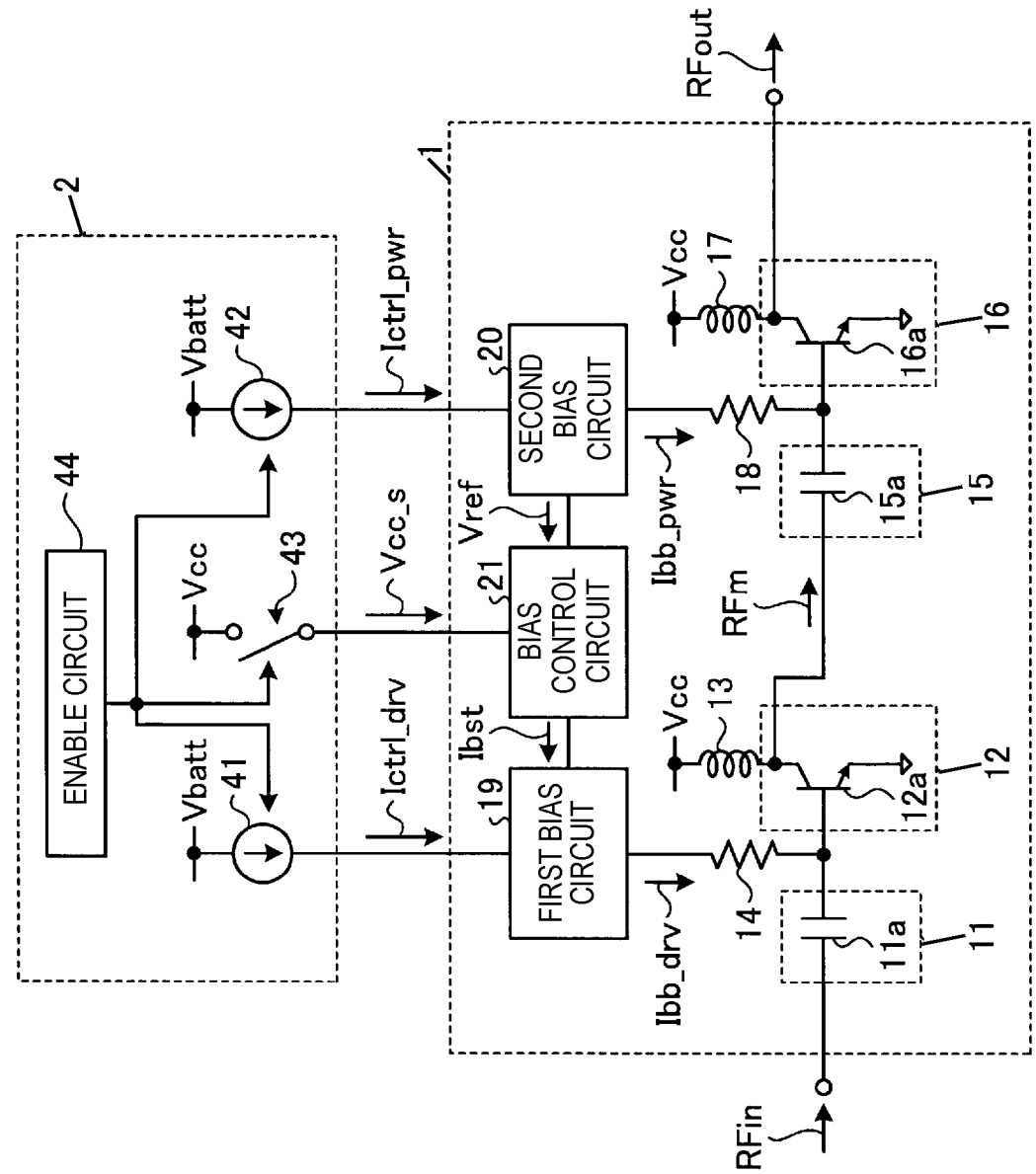
FIG. 1 is a diagram illustrating a circuit configuration of a current output circuit according to a first embodiment of the present disclosure.

FIG. 1 is a diagram illustrating a circuit configuration of a power amplifier circuit according to a first embodiment. A power amplifier circuit 1 is usable for transmitting and receiving various signals such as voice, data, and the like to and from a base station in a mobile communication device exemplified by a mobile phone device.

The power amplifier circuit 1 amplifies a high-frequency input signal RFin which is a radio frequency inputted from a circuit in a preceding stage. Then, the power amplifier circuit 1 outputs an amplified high-frequency output signal RFout to a circuit in a subsequent stage. The circuit in the preceding stage is exemplified by a transmission power control circuit for adjusting the power of a modulation signal, but is not limited thereto. As the circuit in the subsequent stage, a front-end circuit which performs filtering or the like on the high-frequency output signal RFout to transmit the signal to an antenna is exemplified, but is not limited thereto.

The frequencies of the high-frequency input signal RFin and the high-frequency output signal RFout are exemplified by about several 100 megahertz (MHz) to about several 10 gigahertz (GHz), but is not limited thereto.

The power amplifier circuit 1 includes a first matching circuit 11, a first power amplifier 12, inductors 13 and 17, resistors 14 and 18, a second matching circuit 15, a second power amplifier 16, a first bias circuit 19, a second bias circuit 20, and a bias control circuit 21.

In the first embodiment, the power amplifier circuit 1 includes two stages of power amplifiers, that is, the first power amplifier 12 and the second power amplifier 16, but the present disclosure is not limited thereto. The power amplifier circuit 1 may include three or more stages of power amplifiers.

The first power amplifier 12 may be referred to as a first stage or a drive stage. The second power amplifier 16 may be referred to as a final stage or a power stage.

The first power amplifier 12, the resistors 14 and 18, the second power amplifier 16, the first bias circuit 19, the second bias circuit 20, and the bias control circuit 21 may be formed on or in a semiconductor chip (die), but the present disclosure is not limited thereto. The first matching circuit 11, the inductors 13 and 17, and the second matching circuit 15 may be formed on or in a substrate on which a semiconductor chip is mounted, but the present disclosure is not limited thereto.

A control circuit 2 includes a first constant current source 41, a second constant current source 42, a switch 43, and an enable circuit 44.

The control circuit 2 may be formed on or in a semiconductor chip other than a semiconductor chip on or in which the power amplifier circuit 1 is formed, but the present disclosure is not limited thereto.

The enable circuit 44 controls the power amplifier circuit 1 to perform power amplification (enable) or stop power amplification (disable). When the power amplifier circuit 1 performs the power amplification, the enable circuit 44 outputs a first level enable signal to operate the first constant current source 41 and the second constant current source 42 and turns on the switch 43. When the enable circuit 4 disables the power amplifier circuit 1 from performing the power amplification, the enable circuit 44 outputs a second level enable signal to stop the first constant current source 41 and the second constant current source 42 and turns off the switch 43.

When the enable signal is at the first level (in operation), the first constant current source 41 outputs the first constant current Ictrl_drv to the first bias circuit 19 by using DC power of the power supply potential Vbatt. When the enable signal is at the second level (in stop), the first constant current source 41 does not output the first constant current Ictrl_drv to the first bias circuit 19.

The power supply potential Vbatt corresponds to a "first power supply potential" of the present disclosure.

When the enable signal is at the first level (in operation), the second constant current source 42 outputs the second constant current Ictrl_pwr to the second bias circuit 20 by using the DC power of the power supply potential Vbatt. When the enable signal is at the second level (in stop), the second constant current source 42 does not output the second constant current Ictrl_pwr to the second bias circuit 20.

When the enable signal is at the first level (in operation), the switch 43 electrically connects the power supply potential Vcc to the bias control circuit 21. As a result, a power supply potential Vcc_s is supplied to the bias control circuit 21. The power supply potential Vcc_s has the same potential as the power supply potential Vcc. When the enable signal is at the second level (in stop), the switch 43 electrically disconnects the power supply potential Vcc from the bias control circuit 21. As a result, the power supply potential Vcc_s is not supplied to the bias control circuit 21.

The switch 43 is exemplified by a transistor which receives the power supply potential Vcc at a collector, receives the enable signal at a base, and outputs the power supply potential Vcc_s from an emitter, but the present disclosure is not limited thereto. In the present disclosure, the switch 43 is described as a bipolar transistor, but may be a field effect transistor (FET). In that case, the collector may be replaced with a drain, the base may be replaced with a gate, and the emitter may be replaced with a source.

The power supply potentials Vcc and Vcc_s correspond to a "second power supply potential" of the present disclosure.

The first matching circuit 11 includes a capacitor 11a, but the present disclosure is not limited thereto. The first matching circuit 11 may be configured by appropriately combining a capacitor, an inductor, and the like. The capacitor 11a serves as a DC cut capacitor which blocks a DC component of the high-frequency input signal RFin and allows an AC component to pass.

The first power amplifier 12 includes a transistor 12a.

In this disclosure, each transistor is a bipolar transistor, but the present disclosure is not limited thereto. A heterojunction bipolar transistor (HBT) is exemplified as the bipolar transistor, but the present disclosure is not limited thereto. Each transistor may be, for example, the field effect transistor (FET). Each transistor may be a multi-finger transistor in which unit transistors (also referred to as fingers) are electrically connected in parallel. The unit transistor refers to a minimum configuration in which a transistor is configured.

An emitter of the transistor 12a is electrically connected to a first reference potential. The first reference potential is exemplified by a ground potential, but the present disclosure is not limited thereto.

A collector of the transistor 12a is electrically connected to one end of the inductor 13. The other end of the inductor 13 is electrically connected to the power supply potential Vcc. The inductor 13 supplies the DC power of the power supply potential Vcc to the collector of the transistor 12a. A collector current flows from the power supply potential Vcc to the collector of the transistor 12a via the inductor 13.

The inductor 13 has a sufficiently high impedance with respect to the frequency band of the high-frequency input signal RFin. That is, the impedance of the inductor 13 is negligible when considering the frequency band of the high-frequency input signal RFin. Further, the inductor 13 suppresses the coupling of the high-frequency input signal RFin to the power supply circuit. That is, the inductor 13 functions as a choke inductor.

The high-frequency input signal RFin is inputted to a base of the transistor 12a via the capacitor 11a.

The base of the transistor 12a is electrically connected to one end of the resistor 14. The other end of the resistor 14 is electrically connected to the first bias circuit 19.

The first bias circuit 19 outputs a first bias current Ibb_drv corresponding to the first constant current Ictrl_drv to the other end of the resistor 14. The first bias current Ibb_drv is inputted to the base of the transistor 12a via the resistor 14.

An electric bias state of the transistor 12a is set by the first bias current Ibb_drv. The transistor 12a outputs a high-frequency signal RFm obtained by power-amplifying the high-frequency input signal RFin from the collector to the second matching circuit 15.

The second matching circuit 15 includes a capacitor 15a, but the present disclosure is not limited thereto. The second matching circuit 15 may be configured by appropriately combining a capacitor, an inductor, and the like. The capacitor 15a serves as a DC cut capacitor which blocks a DC component of the high-frequency signal RFm and allows an AC component to pass.

The second power amplifier 16 includes a transistor 16a. An emitter of the transistor 16a is electrically connected to the first reference potential.

A collector of the transistor 16a is electrically connected to one end of the inductor 17. The other end of the inductor 17 is electrically connected to the power supply potential Vcc. The inductor 17 supplies the DC power of the power supply potential Vcc to the collector of the transistor 16a. A collector current flows from the power supply potential Vcc to the collector of the transistor 16a via the inductor 17.

The inductor 17 has a sufficiently high impedance with respect to the frequency band of the high-frequency signal RFm. That is, the impedance of the inductor 17 is negligible when considering the frequency band of the high-frequency signal RFm. Further, the inductor 17 suppresses the coupling of the high-frequency signal RFm to the power supply circuit. That is, the inductor 17 functions as a choke inductor.

The high-frequency signal RFm is inputted to a base of the transistor 16a via the capacitor 15a.

The base of the transistor 16a is electrically connected to one end of a resistor 18. The other end of the resistor 18 is electrically connected to the second bias circuit 20.

The second bias circuit 20 outputs a second bias current Ibb_pwr corresponding to the second constant current Ictrl_pwr to the other end of the resistor 18. The second bias current Ibb_pwr is inputted to the base of the transistor 16a via the resistor 18.

An electric bias state of the transistor 16a is set by the second bias current Ibb_pwr. The transistor 16a outputs the high-frequency output signal RFout obtained by power-amplifying the high-frequency signal RFm from the collector.

The bias control circuit 21 receives a second reference potential Vref which is a potential of a portion in the second bias circuit 20 and which varies in accordance with power of the high-frequency output signal RFout. Then, the bias control circuit 21 outputs a bias control current Ibst for increasing the first bias current Ibb_drv to the first bias circuit 19 based on the second reference potential Vref.

Figure 2:
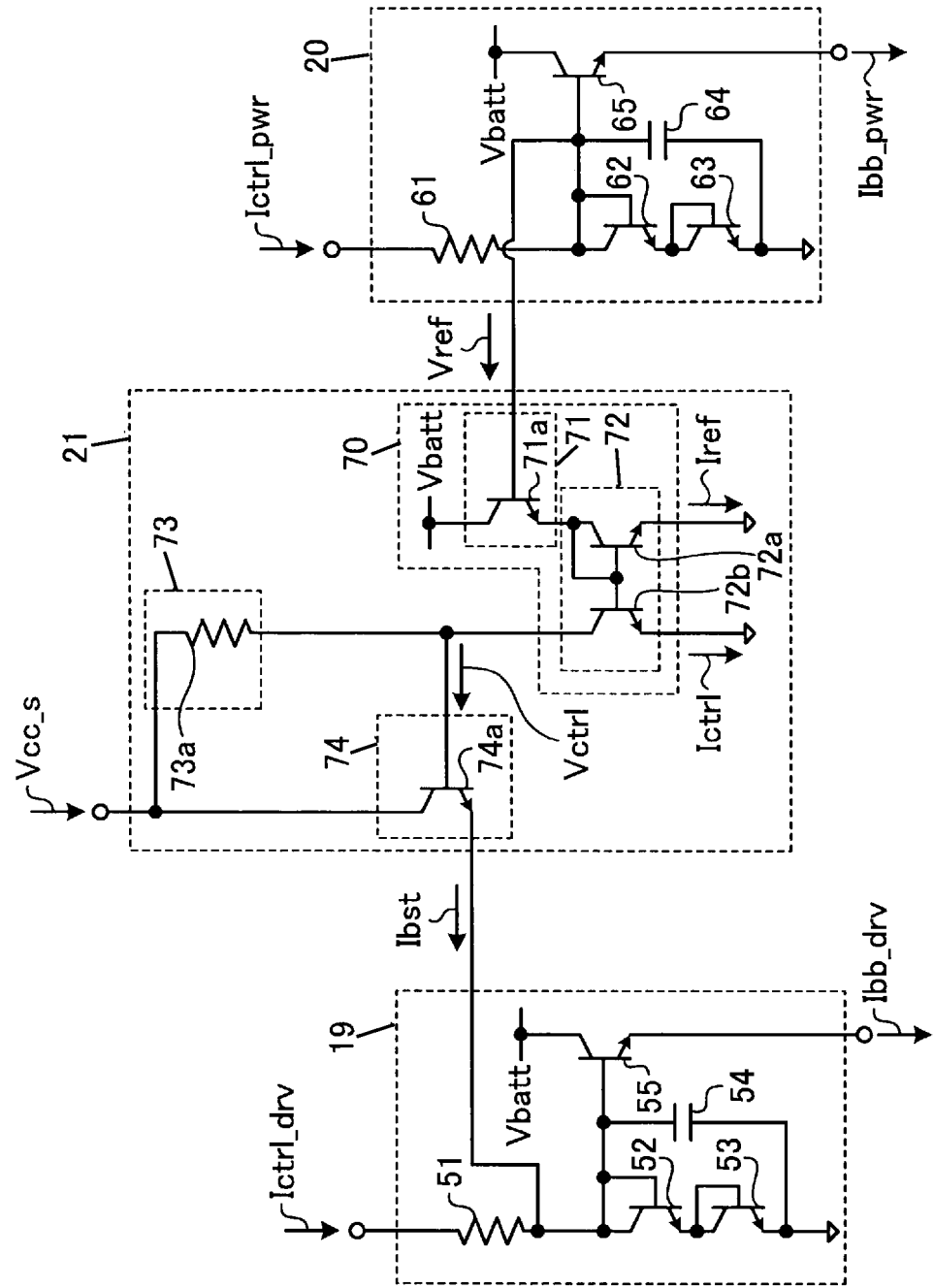
FIG. 2 is a diagram illustrating a circuit configuration of the current output circuit according to the first embodiment of the present disclosure.

FIG. 2 is a diagram illustrating a circuit configuration of the power amplifier circuit according to the first embodiment. Specifically, FIG. 2 is a diagram illustrating a circuit configuration of the first bias circuit 19, the second bias circuit 20, and the bias control circuit 21.

The first bias circuit 19 includes a resistor 51, transistors 52, 53, and 55, and a capacitor 54.

The first constant current Ictrl_drv is inputted to one end of the resistor 51 from the first constant current source 41 (see FIG. 1).

A collector and a base of the transistor 52 are electrically connected to the other end of the resistor 51. The transistor 52 is equivalent to a diode because the collector and the base are electrically connected. The configuration for electrically connecting the collector and the base of the transistor is hereinafter referred to as diode connection.

The transistor 52 corresponds to a "ninth transistor" of the present disclosure.

The collector and base of the transistor 53 are electrically connected to an emitter of the transistor 52. That is, the transistor 53 is diode-connected. The emitter of the transistor 53 is connected to the first reference potential.

The transistor 53 corresponds to a "tenth transistor" of the present disclosure.

The potentials of the collector and base of transistor 52 correspond to the potential drops of the collector-emitter path of transistor 52 and the collector-emitter path of transistor 53. That is, the voltage drop corresponds to the voltage drops of two diodes.

One end of the capacitor 54 is electrically connected to the collector and the base of the transistor 52. The other end of the capacitor 54 is electrically connected to the first reference potential. The capacitor 54 stabilizes the potentials of the collector and base of the transistor 52, and grounds a potential of the base of the transistor 55 in an AC manner.

The power supply potential Vbatt is inputted to a collector of the transistor 55. A base of the transistor 55 is electrically connected to the collector and the base of the transistor 52, and to one end of the capacitor 54.

Most of the first constant current Ictrl_drv inputted to the resistor 51 flows to the first reference potential via the transistors 52 and 53. The remaining portion of the first constant current Ictrl_drv becomes a base current of the transistor 55.

An emitter of the transistor 55 is electrically connected to the other end of the resistor 14 (see FIG. 1). That is, the transistor 55 is emitter-follower connected. As a result, the potential of the base of the transistor 12a (see FIG. 1) is stabilized. The transistor 55 outputs an emitter current corresponding to the base current to the other end of the resistor 14 (see FIG. 1) as the first bias current Ibb_drv.

The transistor 55 corresponds to an "eighth transistor" of the present disclosure.

The second bias circuit 20 includes a resistor 61, transistors 62, 63, and 65, and a capacitor 64.

The second constant current Ictrl_pwr is inputted to one end of the resistor 61 from the second constant current source 42 (see FIG. 1).

A collector and a base of the transistor 62 are electrically connected to the other end of the resistor 61. That is, the transistor 62 is diode-connected.

The transistor 62 corresponds to a "fifth transistor" of the present disclosure.

A collector and a base of the transistor 63 are electrically connected to an emitter of the transistor 62. That is, the transistor 63 is diode-connected. An emitter of the transistor 63 is connected to the first reference potential.

The transistor 63 corresponds to a "sixth transistor" of the present disclosure.

Potentials of the collector and base of transistor 62 correspond to potential drops of a collector-emitter path of transistor 62 and a collector-emitter path of transistor 63. That is, the potential drop corresponds to the potential drops of two diodes.

One end of the capacitor 64 is electrically connected to the collector and the base of the transistor 62. The other end of the capacitor 64 is electrically connected to the first reference potential. The capacitor 64 stabilizes potentials of the collector and base of the transistor 62, and grounds a potential of the base of the transistor 65 in an AC manner.

The power supply potential Vbatt is inputted to a collector of the transistor 65. A base of the transistor 65 is electrically connected to the collector and the base of the transistor 62, and to one end of the capacitor 64.

Transistor 65 corresponds to a "fourth transistor" of the present disclosure.

Most of the second constant current Ictrl_pwr inputted to resistor 61 flows to the first reference potential via the transistors 62 and 63. The remaining portion of the second constant current Ictrl_pwr becomes the base current of the transistor 65.

An emitter of the transistor 65 is electrically connected to the other end of the resistor 18 (see FIG. 1). That is, the transistor 65 is emitter-follower connected. As a result, the potential of the base of the transistor 16a (see FIG. 1) is stabilized. The transistor 65 outputs an emitter current corresponding to the current flowing through the base to the other end of the resistor 18 (see FIG. 1) as the second bias current Ibb_pwr.

Configuration of Bias Control Circuit

The bias control circuit 21 includes a current output circuit 70, a potential output circuit 73, and a first voltage-current conversion circuit 74.

The current output circuit 70 outputs a control current Ictrl corresponding to the second reference potential Vref in the second bias circuit 20. The second reference potential Vref is the potential of the base of the transistor 65, but the present disclosure is not limited thereto.

The current output circuit 70 corresponds to a "first circuit" of the present disclosure.

The current output circuit 70 includes a second voltage-current conversion circuit 71 and a current adjustment circuit 72.

The second voltage-current conversion circuit 71 outputs a reference current Iref corresponding to the second reference potential Vref in the second bias circuit 20.

The second voltage-current conversion circuit 71 includes a transistor 71a, but the present disclosure is not limited thereto. The second voltage-current conversion circuit 71 may be any circuit that outputs a current corresponding to a voltage (potential).

The power supply potential Vbatt is inputted to a collector of the transistor 71a. A base of the transistor 71a is electrically connected to the base of the transistor 65. Thereby, the second reference potential Vref is inputted to the base of the transistor 71a. The transistor 71a outputs an emitter current corresponding to a voltage between the power supply potential Vbatt and the second reference potential Vref as the reference current Iref.

The transistor 71a corresponds to a "first transistor" of the present disclosure.

The current adjustment circuit 72 outputs the control current Ictrl corresponding to the reference current Iref. The current adjustment circuit 72 includes transistors 72a and 72b.

A collector and a base of the transistor 72a are electrically connected to an emitter of the transistor 71a. That is, the transistor 72a is diode-connected. An emitter of the transistor 72a is electrically connected to the first reference potential. Therefore, the reference current Iref flows through a collector-emitter path of the transistor 72a.

The transistor 72a corresponds to a "second transistor" of the present disclosure.

A base of the transistor 72b is electrically connected to the base and the collector of the transistor 72a. That is, the transistors 72a and 72b configures a current mirror circuit.

The control current Ictrl corresponding to the reference current Iref flows through a collector-emitter path of the transistor 72b. For example, when a size (number of fingers) of the transistor 72b is the same as a size (the number of fingers) of the transistor 72a, the control current Ictrl becomes the same as the reference current Iref. For example, when the size (the number of fingers) of the transistor 72b is larger than the size (number of fingers) of the transistor 72a, the control current Ictrl becomes larger than the reference current Iref. For example, when the size (number of fingers) of the transistor 72b is smaller than the size (number of fingers) of the transistor 72a, the control current Ictrl becomes smaller than the reference current Iref.

The transistor 72b corresponds to a "third transistor" of the present disclosure.

The potential output circuit 73 outputs a control potential Vctrl corresponding to the control current Ictrl based on the power supply potential Vcc_s. The potential output circuit 73 includes a resistor 73a, but the present disclosure is not limited thereto. The potential output circuit 73 may be a circuit that outputs a potential corresponding to a current.

The power supply potential Vcc_s is inputted to one end of the resistor 73a via the switch 43 (see FIG. 1). The other end of the resistor 73a is electrically connected to a collector of the transistor 72b.

The resistor 73a generates a potential drop corresponding to the control current Ictrl, and outputs the control potential Vctrl. The control potential Vctrl is a potential obtained by subtracting a potential drop at the resistor 73a (the product of the resistance value of the resistor 73a and the control current Ictrl) from the power supply potential Vcc_s.

The control potential Vctrl can be adjusted by adjusting the resistance value of the resistor 73a.

The potential output circuit 73 corresponds to a "second circuit" of the present disclosure. The resistor 73a corresponds to a "first resistor" of the present disclosure.

The first voltage-current conversion circuit 74 outputs a bias control current Ibst corresponding to the power supply potential Vcc_s and the control potential Vctrl. The first voltage-current conversion circuit 74 includes a transistor 74a, but the present disclosure is not limited thereto. The first voltage-current conversion circuit 74 may be any circuit that outputs a current corresponding to a voltage (potential).

The power supply potential Vcc_s is inputted to a collector of the transistor 74a via the switch 43 (see FIG. 1). A base of the transistor 74a is electrically connected to the other end of the resistor 73a and the collector of the transistor 72b. Thereby, the control potential Vctrl is inputted to the base of the transistor 74a. An emitter which is an output terminal of the transistor 74a is electrically connected to the collector and the base of the transistor 52, and to the base of the transistor 55. The transistor 74a outputs an emitter current corresponding to the collector potential (power supply potential Vcc_s) and the potential of the base (control potential Vctrl) as the bias control current Ibst to the collector and the base of the transistor 52, and to the base of the transistor 55.

A current value of the bias control current Ibst can be adjusted by adjusting the size (the number of fingers) of the transistor 74a.

The first voltage-current conversion circuit 74 corresponds to a "third circuit" of the present disclosure. Transistor 74a corresponds to a "fourteenth transistor" of the present disclosure.

Operation of Bias Control Circuit
Operation of Second Voltage-current Conversion Circuit When the power of the high-frequency output signal RFout outputted from the transistor 16a (see FIG. 1) increases, a collector current of the transistor 16a increases. When the collector current of the transistor 16a increases, the second bias current Ibb_pwr, which is a base current of the transistor 16a, also increases. Thereby, a ratio of the base current of the transistor 65 in the second constant current Ictrl_pwr increases. In other words, a ratio of the current flowing through the transistors 62 and 63 in the second constant current Ictrl_pwr decreases. That is, the current flowing through the transistors 62 and 63 decreases, and the base current of the transistor 65 increases. As the current flowing through transistors 62 and 63 decreases, the voltage drop across transistors 62 and 63 decreases. Therefore, the potential of the base of the transistor 65 decreases.

Conversely, when the power of the high-frequency output signal RFout outputted from the transistor 16a decreases, the potential of the base of the transistor 65 increases.

That is, the second reference potential Vref which is the potential of the base of the transistor 65 is a potential which varies in accordance with the power of the high-frequency output signal RFout.

When the power of the high-frequency output signal RFout increases, the heat of the transistor 16a increases, a gain of the transistor 16a decreases, and the transistor 16a approaches a saturation state. That is, the second reference potential Vref which is the potential of the base of the transistor 65 is a potential which varies in accordance with the gain of the transistor 16a.

When the second reference potential Vref decreases, the potential of the base of the transistor 71a decreases, so that the reference current Iref which is an emitter current of the transistor 71a decreases.

That is, when the power of the high-frequency output signal RFout increases, the gain of the transistor 16a decreases, and the second reference potential Vref decreases, the reference current Iref decreases.

Conversely, when the second reference potential Vref increases, the potential of the base of the transistor 71a increases, so that the reference current Iref which is the emitter current of the transistor 71a increases.

That is, when the power of the high-frequency output signal RFout decreases, the gain of the transistor 16a increases, and the second reference potential Vref increases, the reference current Iref increases.

Operation of Current Adjustment Circuit

The transistors 72a and 72b configure the current mirror circuit. Accordingly, when the reference current Iref decreases, the control current Ictrl decreases.

That is, when the power of the high-frequency output signal RFout increases, the gain of the transistor 16a decreases, and the reference current Iref decreases, the control current Ictrl decreases.

Conversely, when the reference current Iref increases, the control current Ictrl increases.

That is, when the power of the high-frequency output signal RFout decreases, the gain of the transistor 16a increases, and the reference current Iref increases, the control current Ictrl increases.

Operation of Potential Output Circuit

The potential drop in the potential output circuit 73 decreases when the control current Ictrl decreases.

That is, when the power of the high-frequency output signal RFout increases, the gain of the transistor 16a decreases, and the control current Ictrl decreases, the control potential Vctrl increases.

Conversely, the potential drop in the potential output circuit 73 increases when the control current Ictrl increases.

That is, when the power of the high-frequency output signal RFout decreases, the gain of the transistor 16a increases, and the control current Ictrl increases, the control potential Vctrl decreases.

Operation of First Voltage-Current Conversion Circuit

When the control potential Vctrl increases, the potential of the base of the transistor 74a increases, so that the bias control current Ibst which is the emitter current of the transistor 74a increases.

That is, when the power of the high-frequency output signal RFout increases, the gain of the transistor 16a decreases, and the control potential Vctrl increases, the bias control current Ibst increases.

Conversely, when the control potential Vctrl decreases, the potential of the base of the transistor 74a decreases, so that the bias control current Ibst which is the emitter current of the transistor 74a decreases.

That is, when the power of the high-frequency output signal RFout decreases, the gain of the transistor 16a increases, and the control potential Vctrl decreases, the bias control current Ibst decreases.

Operation of Bias Control Current to First Bias Control Circuit

Most of the bias control current Ibst flows to the first reference potential via the transistors 52 and 53. The remaining portion of the bias control current Ibst is added to the base current of the transistor 55.

When the bias control current Ibst increases, the potential of the base of the transistor 55 (i.e., the potential drop at the transistors 52 and 53) increases, and the base current of the transistor 55 increases. As a result, the first bias current Ibb_drv which is the emitter current of the transistor 55 increases. When the first bias current Ibb_drv increases, a gain of the transistor 12a increases.

That is, when the power of the high-frequency output signal RFout increases, the gain of the transistor 16a decreases, and the bias control current Ibst increases, the gain of the transistor 12a increases.

Conversely, when the bias control current Ibst decreases, the potential of the base of the transistor 55 (i.e., the potential drop in the transistors 52 and 53) decreases, and the base current of the transistor 55 decreases. As a result, the first bias current Ibb_drv which is the emitter current of the transistor 55 decreases. When the first bias current Ibb_drv decreases, the gain of the transistor 12a decreases.

That is, when the power of the high-frequency output signal RFout decreases, the gain of the transistor 16a increases, and the bias control current Ibst decreases, the gain of the transistor 12a decreases.

SUMMARY

As described above, when the power of the high-frequency output signal RFout increases and the gain of the transistor 16a decreases, the second reference potential Vref decreases. When the second reference potential Vref decreases, the bias control circuit 21 increases the bias control current Ibst. When the bias control current Ibst increases, the gain of the transistor 12a increases. Note that the first power amplifier 12 (driver stage) has a smaller size and lower power consumption than the second power amplifier 16 (power stage), so that the influence of the heat generation is small.

As described above, the power amplifier circuit 1 can compensate for a decrease in a gain of the second power amplifier 16 by an increase in a gain of the first power amplifier 12. Thereby, the power amplifier circuit 1 can suppress a decrease in the gain in the entire power amplifier circuit 1.

The transistor 71a in the second voltage-current conversion circuit 71 and the transistor 72a in the current adjustment circuit 72 are connected in series between the power supply potential Vbatt and the first reference potential. Therefore, the bias control circuit 21 can lower the power supply potential Vbatt by an amount of the transistor 246 (see U.S. Patent Application Publication No. 2017/0141734) as compared with the power amplifier circuit described in U.S. Patent Application Publication No. 2017/0141734. Thus, the bias control circuit 21 can operate at a low power supply potential.

The power supply potential Vcc_s is inputted to one end of the resistor 73a in the potential output circuit 73 and the collector of the transistor 74a in the first voltage-current conversion circuit 74. The power supply potential Vcc_s has the same potential as the collector bias (collector potential) of the transistor 12a in the first power amplifier 12 and the power supply potential Vcc which is the collector bias of the transistor 16a in the second power amplifier 16. Accordingly, when the power supply potential Vcc is varied by the envelope tracking control, the power supply potential Vcc_s is also varied. Thus, potentials of the collector and base of the transistor 74a are also varied, so that the bias control current Ibst is also varied. Therefore, the bias control circuit 21 can output the bias control current Ibst corresponding to the envelope tracking control. That is, the bias control circuit 21 is capable of performing envelope tracking control.

When the enable signal inputted from the enable circuit 44 is at the second level, the switch 43 cuts off the power supply potential Vcc_s.

In a case that the switch 43 is not present, and the power supply potential Vcc is constantly inputted to the potential output circuit 73 and the first voltage-current conversion circuit 74, the first voltage-current conversion circuit 74 constantly outputs the bias control current Ibst to the first bias circuit 19. Then, even when the first constant current Ictrl_drv is zero amperes, the transistor 55 is operated by the bias control current Ibst. That is, the first bias current Ibb_drv always flows to the base of the transistor 12a, so that the first power amplifier 12 always operates.

However, in the present embodiment, when the enable signal is at the second level, the switch 43 cuts off the power supply potential Vcc_s. As a result, the first voltage-current conversion circuit 74 does not output the bias control current Ibst to the first bias circuit 19, so that the transistor 55 does not operate. Therefore, the first bias current Ibb_drv does not flow to the base of the transistor 12a. Accordingly, the bias control circuit 21 can prevent the first power amplifier 12 from operating when the enable signal is at the second level (when disabled).

Second Embodiment

Figure 3:
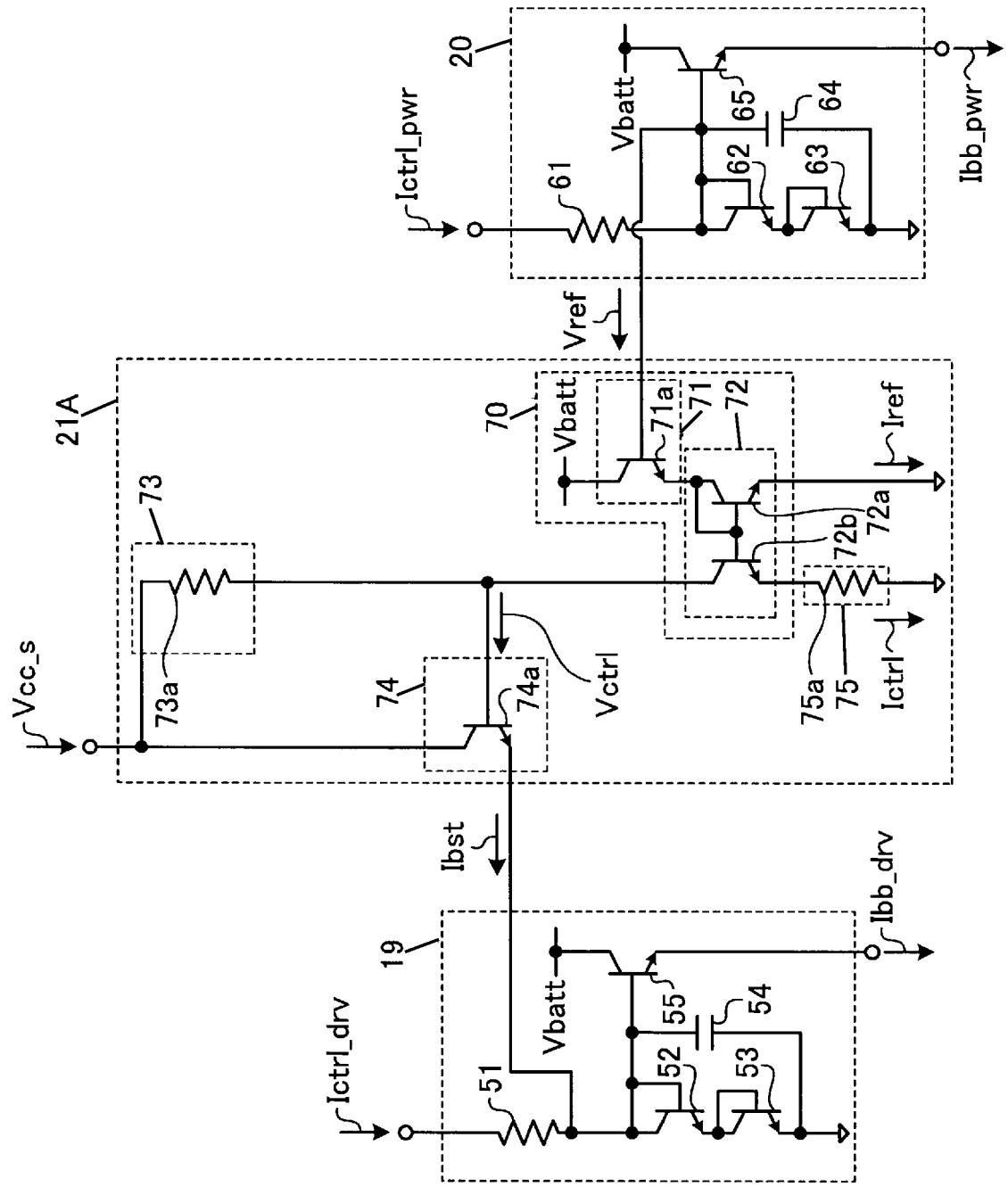
FIG. 3 is a diagram illustrating a circuit configuration of a power amplifier circuit according to a second embodiment.

FIG. 3 is a diagram illustrating a circuit configuration of a power amplifier circuit according to a second embodiment. Specifically, FIG. 3 is the diagram illustrating a circuit configuration of the first bias circuit 19, the second bias circuit 20, and a bias control circuit 21A.

Among the constituent elements of the bias control circuit 21A, constituent elements identical to those in the other embodiments are denoted by the same reference numerals, and the description thereof will not be repeated.

The bias control circuit 21A further includes a resistance variation compensation circuit 75 as compared with the bias control circuit 21 (see FIG. 2).

The resistance variation compensation circuit 75 corresponds to a "fourth circuit" of the present disclosure.

The resistance variation compensation circuit 75 includes a resistor 75a, but the present disclosure is not limited thereto. The resistance variation compensation circuit 75 may be any circuit that causes a potential drop corresponding to a current.

One end of the resistor 75a is electrically connected to the emitter of the transistor 72b. The other end of the resistor 75a is electrically connected to the first reference potential. Accordingly, the control current Ictrl flows through the resistor 75a, and the resistor 75a causes the potential drop. That is, the resistance variation compensation circuit 75 adjusts the control potential Vctrl in response to the control current Ictrl.

In the bias control circuit 21 (see FIG. 2), the resistor 73a and the collector-emitter path of the transistor 72b are connected in series between the power supply potential Vcc_s and the first reference potential. Accordingly, a ratio of a variation (individual difference) in a resistance value of the resistor 73a to the total resistance value (sum of the resistance value of the resistor 73a and the resistance value of the collector-emitter path of the transistor 72b) between the power supply potential Vcc_s and the first reference potential is relatively large. That is, a variation in the control potential Vctrl (error from the desired potential) caused by the variation in the resistance value of the resistor 73a is relatively large.

On the other hand, in the bias control circuit 21A, the control potential Vctrl is determined by the sum of a voltage between a collector and an emitter of the transistor 72b and the potential drop of the resistor 75a and the potential drop of the resistor 73a. When the resistor 73a and the resistor 75a are formed on a same semiconductor wafer (chip), manufacturing variations and temperature fluctuations of the respective resistance values are the same including a polarity. When the voltage between the collector and the emitter of the transistor 72b is constant, the potential of the control potential Vctrl is determined by a ratio of the resistance values of the resistor 73a and the resistor 75a. Therefore, the control potential Vctrl becomes independent of the manufacturing variations and the temperature fluctuations of the resistance values, thereby enabling stable operation to be performed with respect to the manufacturing variations and the temperature fluctuations.

As described above, the resistance variation compensation circuit 75 can suppress the variation in the control potential Vctrl caused by the variation in the resistor 73a. That is, the resistance variation compensation circuit 75 can suppress the error between the control potential Vctrl and the desired potential. Thus, the resistance variation compensation circuit 75 can compensate for the variation in the resistor 73a. Therefore, the bias control circuit 21A can output the bias control current Ibst with higher accuracy.

Third Embodiment

Figure 4:
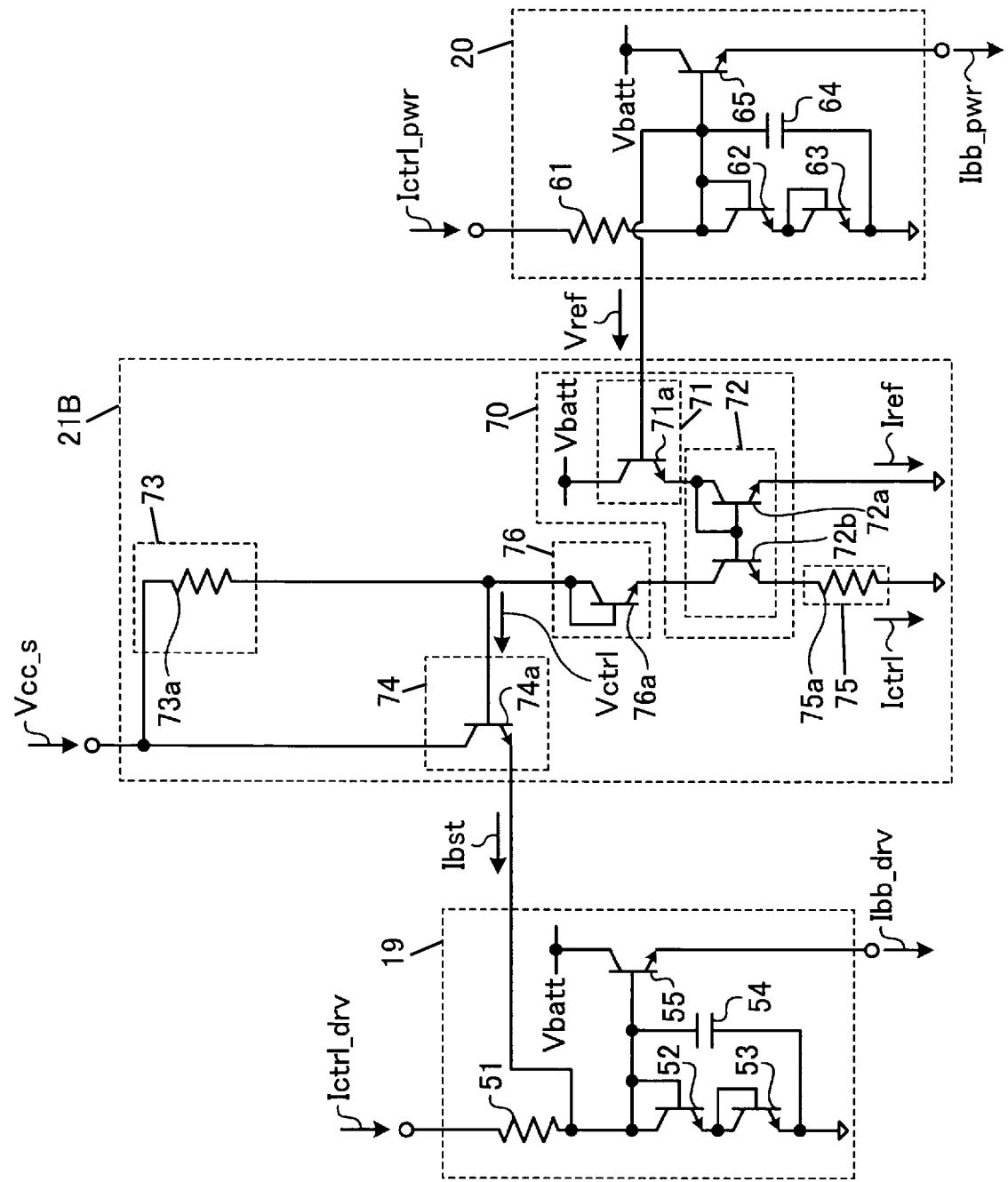
FIG. 4 is a diagram illustrating a circuit configuration of a power amplifier circuit according to a third embodiment.

FIG. 4 is a diagram illustrating a circuit configuration of a power amplifier circuit according to a third embodiment. Specifically, FIG. 4 is the diagram illustrating a circuit configuration of the first bias circuit 19, the second bias circuit 20, and a bias control circuit 21B.

Among the constituent elements of the bias control circuit 21B, constituent elements identical to those in the other embodiments are denoted by the same reference numerals, and the description thereof will not be repeated.

The bias control circuit 21B further includes a potential adjustment circuit 76 as compared with the bias control circuit 21A (see FIG. 3).

The potential adjustment circuit 76 corresponds to a "fifth circuit" of the present disclosure.

The potential adjustment circuit 76 includes a transistor 76a, but the present disclosure is not limited thereto. The potential adjustment circuit 76 may be any circuit that causes a potential drop corresponding to a current.

An emitter of transistor 76a is electrically connected to the collector of the transistor 72b. A collector and a base of the transistor 76a are electrically connected to the other end of the resistor 73a and the base of the transistor 74a. That is, the transistor 76a is diode-connected. The control current Ictrl flows through a collector-emitter path of the transistor 76a. Thus, the transistor 76a causes a potential drop corresponding to the control current Ictrl. That is, the potential adjustment circuit 76 adjusts the control potential Vctrl corresponding to the control current Ictrl.

Each element in the bias control circuit 21B has temperature dependence. Due to the temperature dependence of each element, the control potential Vctrl may fluctuate, and the bias control current Ibst may fluctuate. For example, when the temperature rises, a current driving capability of each transistor increases, so that the control current Ictrl increases. As a result, the potential drop in the resistor 73a increases, and the control potential Vctrl decreases. However, when the temperature rises, a resistance value of the transistor 76a increases, and the transistor 76a operates in a direction of increasing the control potential Vctrl. Thereby, the fluctuation of the control potential Vctrl due to the temperature is suppressed. As described above, the potential adjustment circuit 76 can suppress the temperature dependence of the bias control circuit 21B. Therefore, the bias control circuit 21B can output the bias control current Ibst with higher accuracy.

Fourth Embodiment

Figure 5:
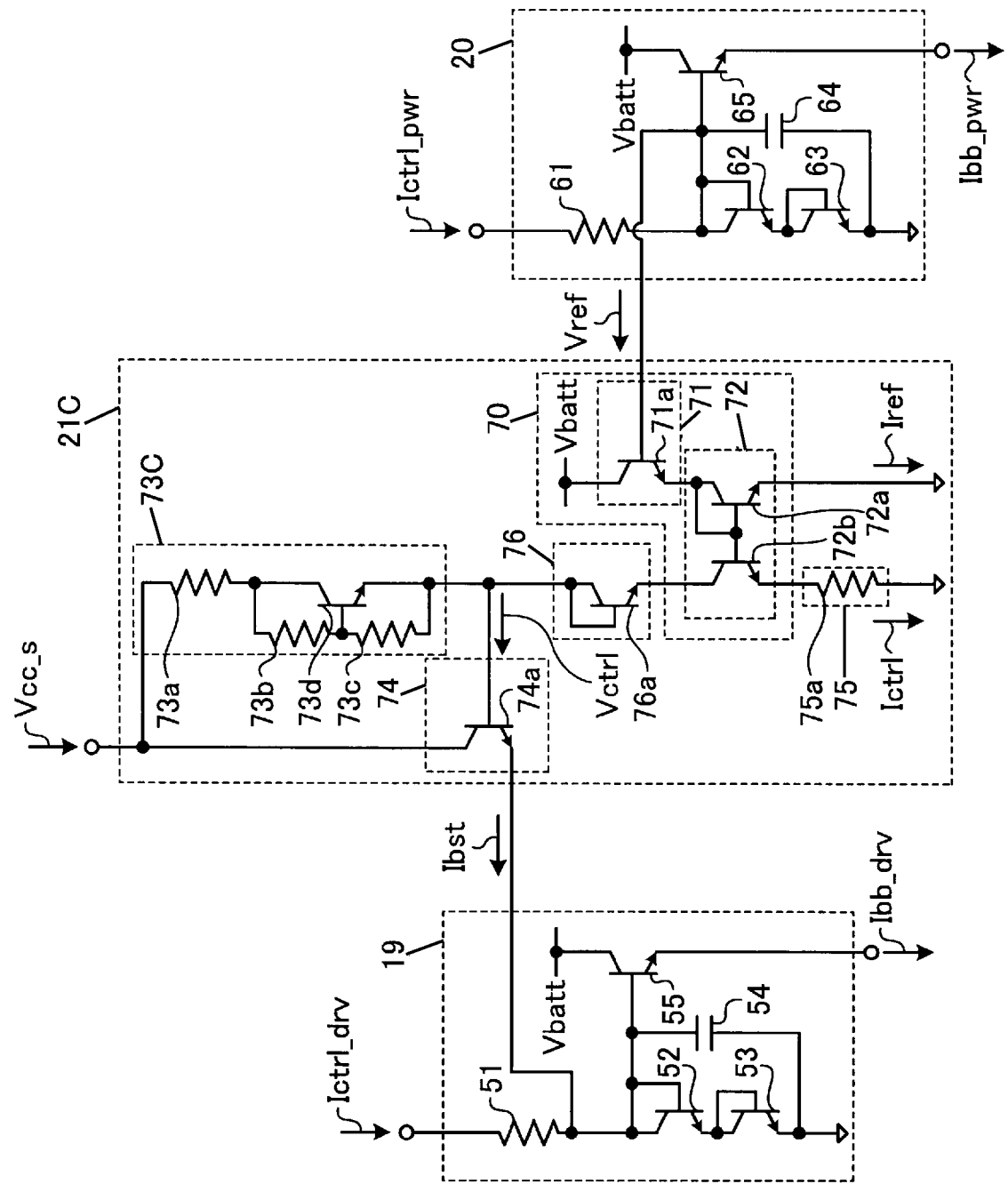
FIG. 5 is a diagram illustrating a circuit configuration of a power amplifier circuit according to a fourth embodiment.

FIG. 5 is a diagram illustrating a circuit configuration of a power amplifier circuit according to a fourth embodiment. Specifically, FIG. 5 is the diagram illustrating a circuit configuration of the first bias circuit 19, the second bias circuit 20, and a bias control circuit 21C.

Among the constituent elements of the bias control circuit 21C, constituent elements identical to those in the other embodiments are denoted by the same reference numerals, and the description thereof will not be repeated.

The bias control circuit 21C includes a potential output circuit 73C instead of the potential output circuit 73 as compared with the bias control circuit 21B (see FIG. 4).

The potential output circuit 73C further includes resistors 73b and 73c and a transistor 73d, as compared with the potential output circuit 73.

One end of the resistor 73b is electrically connected to the other end of the resistor 73a. One end of the resistor 73c is electrically connected to the other end of the resistor 73b. The other end of the resistor 73c is electrically connected to the collector and the base of the transistor 76a, and to the base of the transistor 74a. That is, the resistors 73a, 73b, and 73c are connected in series between the power supply potential Vcc_s and the collector and the base of the transistor 74a.

The resistor 73b corresponds to a "second resistor" of the present disclosure. The resistor 73c corresponds to a "third resistor" of the present disclosure.

A collector of the transistor 73d is electrically connected to the other end of the resistor 73a and one end of the resistor 73b. A base of the transistor 73d is electrically connected to the other end of the resistor 73b and one end of the resistor 73c. An emitter of the transistor 73d is electrically connected to the other end of the resistor 73c.

The transistor 73d corresponds to a "seventh transistor" of the present disclosure.

Three potentials generated by resistive-voltage-dividing of the resistors 73a, 73b, and 73c are inputted to the collector, the base and the emitter of the transistor 73d, respectively. The transistor 73d is turned on or off corresponding to the three potentials.

When the transistor 73d is off, the control potential Vctrl becomes a potential obtained by subtracting the potential drops caused by the resistors 73a, 73b, and 73c from the power supply potential Vcc_s.

When the transistor 73d is on, the control potential Vctrl becomes a potential obtained by subtracting the potential drops caused by the resistor 73a and the on-resistance of a collector-emitter path of the transistor 73d from the power supply potential Vcc_s.

Therefore, the potential output circuit 73C can switch the control potential Vctrl in accordance with the on state or the off state of the transistor 73d. That is, the potential output circuit 73C can switch the bias control current Ibst in accordance with the on state or the off state of the transistor 73d.

For example, when a power supply potential Vcc is varied by envelope tracking control, the power supply potential Vcc_s is also varied. Accordingly, the above-described three potentials are also varied, so that the on state and the off state of the transistor 73d are switched. Therefore, the potential output circuit 73C is capable of switching the bias control current Ibst corresponding to the power supply potential Vcc_s.

As described above, the bias control circuit 21C can switch the transmission characteristics between an input (second reference potential Vref) and an output (bias control current Ibst) corresponding to the power supply potential Vcc_s.

Fifth Embodiment

Figure 6:
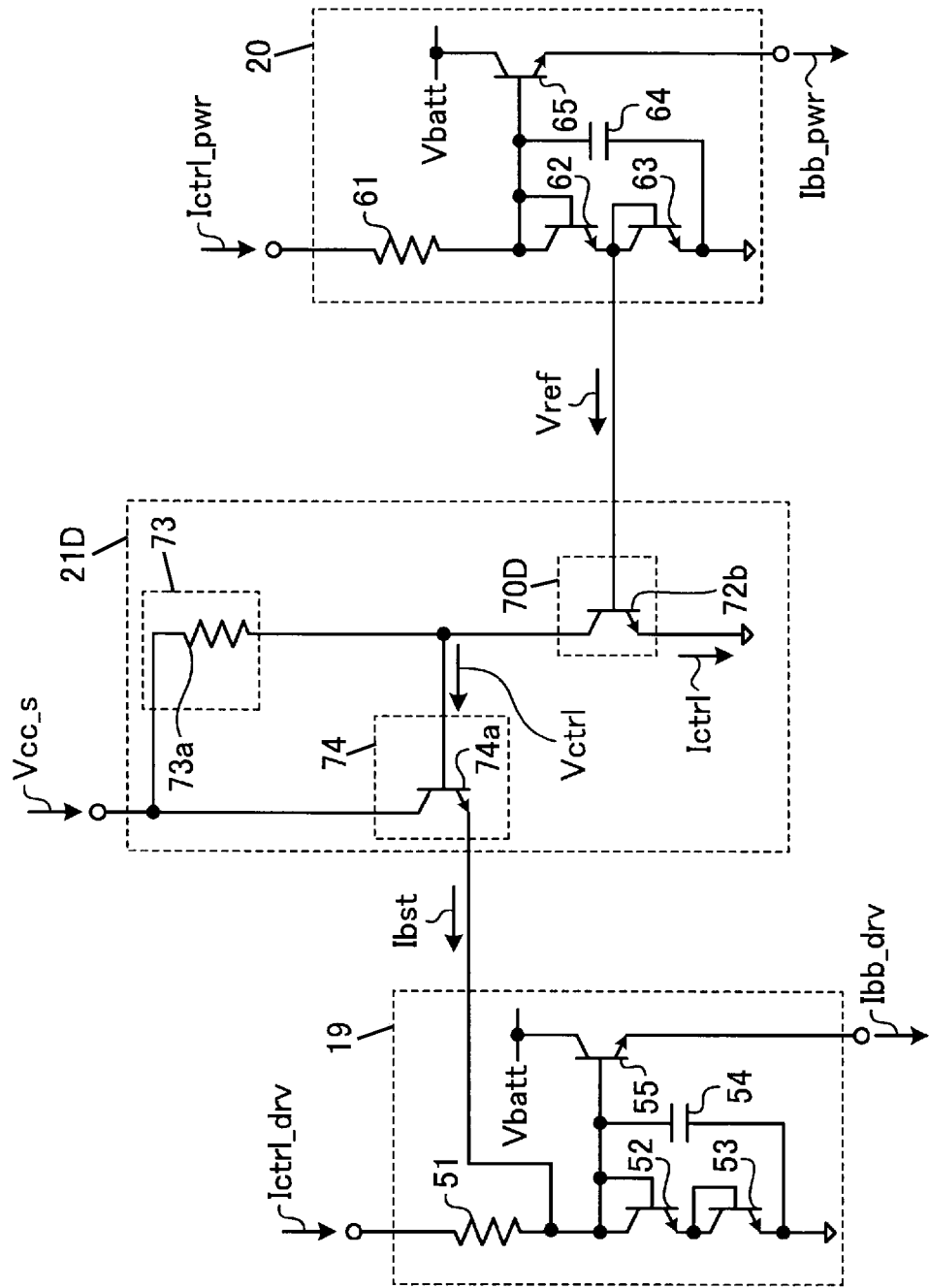
FIG. 6 is a diagram illustrating a circuit configuration of a power amplifier circuit according to a fifth embodiment.

FIG. 6 is a diagram illustrating a circuit configuration of a power amplifier circuit according to a fifth embodiment. Specifically, FIG. 6 is the diagram illustrating a circuit configuration of the first bias circuit 19, the second bias circuit 20, and a bias control circuit 21D.

Among the constituent elements of the bias control circuit 21D, constituent elements identical to those in the other embodiments are denoted by the same reference numerals, and the description thereof will not be repeated.

The bias control circuit 21D includes a current output circuit 70D instead of the current output circuit 70 as compared with the bias control circuit 21 (see FIG. 2). The current output circuit 70D includes the transistor 72b.

A base of transistor 72b is electrically connected to a collector and a base of the transistor 63. The transistor 63 and the transistor 72b configure a current mirror circuit. By changing a size of the transistor 72b, the control current Ictrl can be adjusted.

In the first embodiment, the potential of the base of the transistor 65 is set to the second reference potential Vref. On the other hand, in the fifth embodiment, potentials of the collector and base of the transistor 63 are set to the second reference potential Vref.

As described above, when the power of the high-frequency output signal RFout outputted from the transistor 16a (see FIG. 1) increases, the potential of the base of the transistor 65 decreases. That is, the potentials of the collector and base of the transistor 63 also decrease. Conversely, when the power of the high-frequency output signal RFout outputted from the transistor 16a decreases, the potential of the base of the transistor 65 increases. That is, the potentials of the collector and base of the transistor 63 also increase.

That is, the second reference potential Vref which is the potentials of the collector and base of the transistor 63 is a potential which varies depending on the power of the high-frequency output signal RFout.

When the second reference potential Vref decreases, the potential of the base of the transistor 72b decreases, so that the control current Ictrl which is an emitter current of the transistor 72b decreases.

That is, when the power of the high-frequency output signal RFout increases, a gain of the transistor 16a decreases, and the second reference potential Vref decreases, the control current Ictrl decreases.

Conversely, when the second reference potential Vref increases, the potential of the base of the transistor 72b increases, so that the control current Ictrl which is the emitter current of the transistor 72b increases.

That is, when the power of the high-frequency output signal RFout decreases, the gain of the transistor 16a increases, and the second reference potential Vref increases, the control current Ictrl increases.

Thereby, the bias control circuit 21D achieves the same effects as the bias control circuit 21. Further, the bias control circuit 21D can reduce a size and power consumption due to a reduction in circuit scale.

Additionally, the current output circuit 70D does not include the transistors 71a and 72a as compared with the current output circuit 70.

Thereby, the current output circuit 70D can reduce the number of elements compared with the current output circuit 70, so that a space can be saved, and power consumption can be reduced. Further, the current output circuit 70D can reduce the cost.

Note that the fifth embodiment may be combined with other embodiments. For example, the bias control circuit 21D may include the resistance variation compensation circuit 75 of the bias control circuit 21A (see FIG. 3) of the second embodiment. Further, the bias control circuit 21D may include the potential adjustment circuit 76 of the bias control circuit 21B (see FIG. 4) of the third embodiment. Additionally, the bias control circuit 21D may include the potential output circuit 73C of the bias control circuit 21C (see FIG. 5) of the fourth embodiment instead of the potential output circuit 73.

Sixth Embodiment

Figure 7:
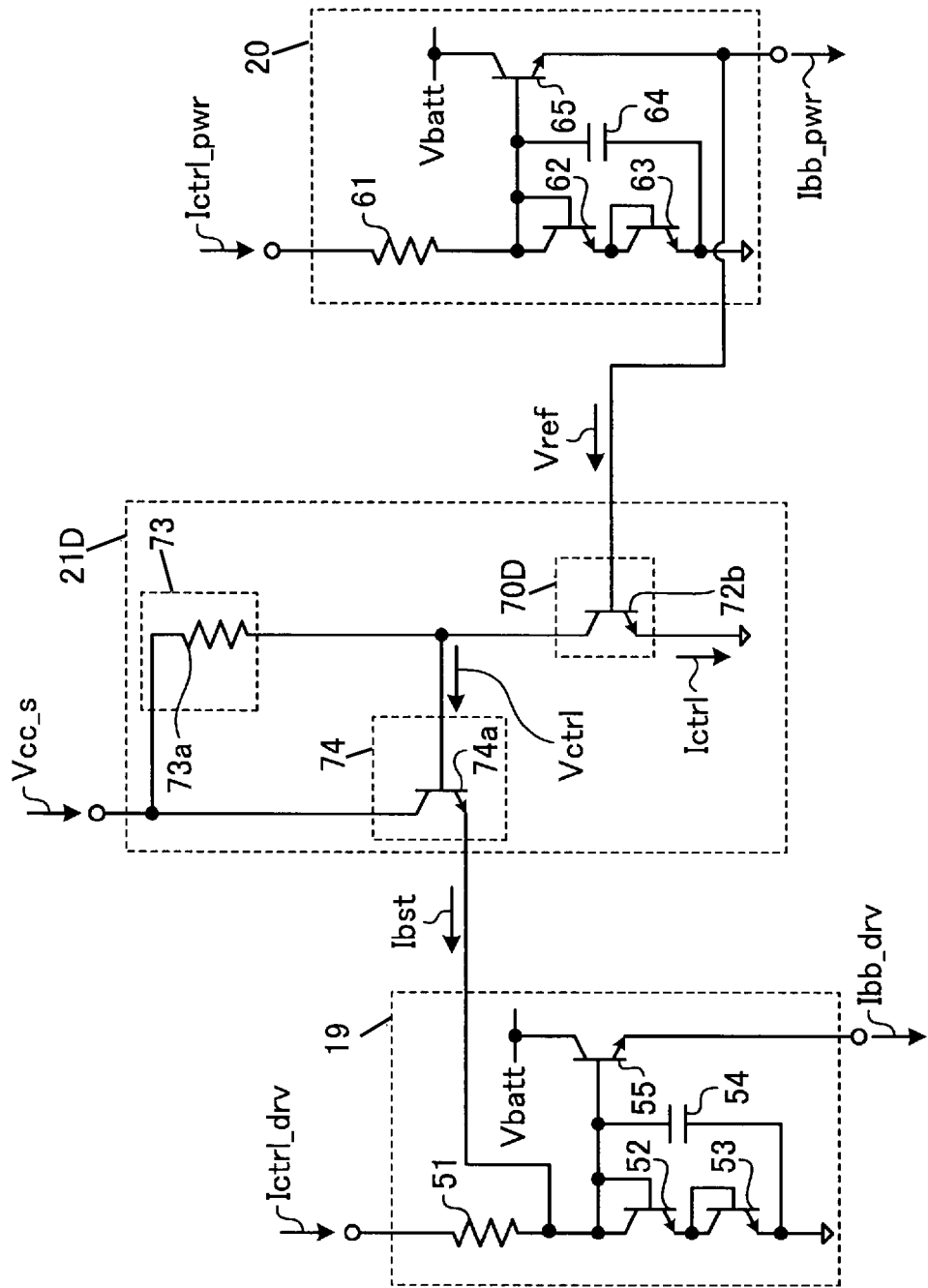
FIG. 7 is a diagram illustrating a circuit configuration of a power amplifier circuit according to a sixth embodiment.

FIG. 7 is a diagram illustrating a circuit configuration of a power amplifier circuit according to a sixth embodiment. Specifically, FIG. 7 is the diagram illustrating the circuit configuration of the first bias circuit 19, the second bias circuit 20, and the bias control circuit 21D.

Since the circuit configuration of the bias control circuit 21D is the same as that of the fifth embodiment, the description thereof will not be repeated.

In the fifth embodiment described above, the potentials of the collector and base of the transistor 63 are set to the second reference potential Vref. On the other hand, in the sixth embodiment, the emitter potential of the transistor 65 is set to the second reference potential Vref.

As described above, when the power of the high-frequency output signal RFout outputted from the transistor 16a (see FIG. 1) increases, a potential of the base of the transistor 65 decreases. That is, an emitter potential of the transistor 65 also decreases. Conversely, when the power of the high-frequency output signal RFout outputted from the transistor 16a decreases, the potential of the base of the transistor 65 increases. That is, the emitter potential of the transistor 65 also increases.

That is, the second reference potential Vref which is the emitter potential of the transistor 65 is a potential which varies in accordance with the power of the high-frequency output signal RFout.

When the second reference potential Vref decreases, the potential of the base of the transistor 72b decreases, so that the control current Ictrl which is the emitter current of the transistor 72b decreases.

That is, when the power of the high-frequency output signal RFout increases, a gain of the transistor 16a decreases, and the second reference potential Vref decreases, the control current Ictrl decreases.

Conversely, when the second reference potential Vref increases, the potential of the base of the transistor 72b increases, so that the control current Ictrl which is the emitter current of the transistor 72b increases.

That is, when the power of the high-frequency output signal RFout decreases, the gain of the transistor 16a increases, and the second reference potential Vref increases, the control current Ictrl increases.

Thus, the sixth embodiment has the same effects as the fifth embodiment.

Note that the sixth embodiment may be combined with other embodiments. For example, the bias control circuit 21D may include the resistance variation compensation circuit 75 of the bias control circuit 21A (see FIG. 3) of the second embodiment. Further, the bias control circuit 21D may include the potential adjustment circuit 76 of the bias control circuit 21B (see FIG. 4) of the third embodiment. Additionally, the bias control circuit 21D may include the potential output circuit 73C of the bias control circuit 21C (see FIG. 5) of the fourth embodiment instead of the potential output circuit 73.

Seventh Embodiment

Figure 8:
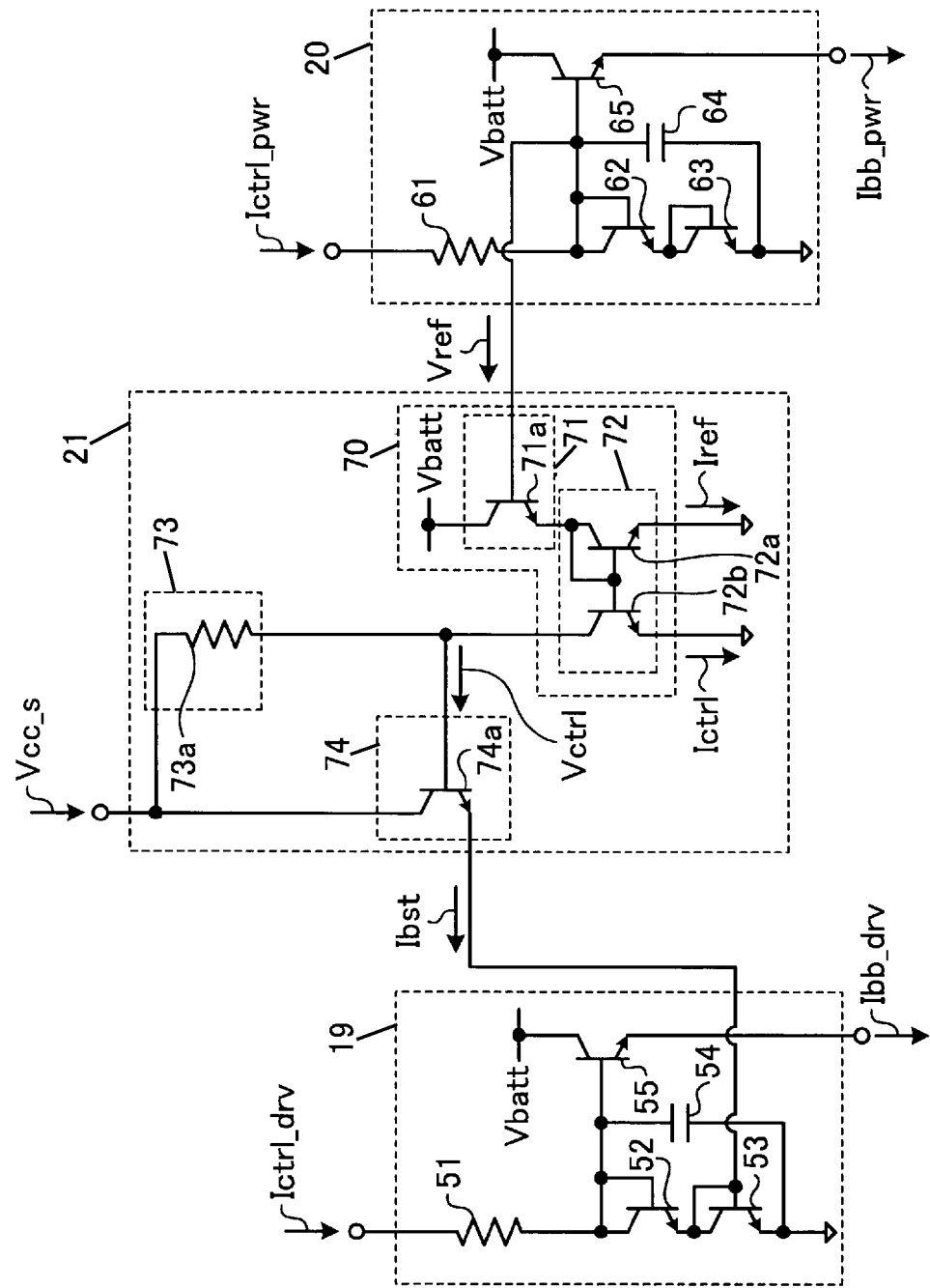
FIG. 8 is a diagram illustrating a circuit configuration of a power amplifier circuit according to a seventh embodiment.

FIG. 8 is a diagram illustrating a circuit configuration of a power amplifier circuit according to a seventh embodiment. Specifically, FIG. 8 is the diagram illustrating the circuit configurations of the first bias circuit 19, the second bias circuit 20, and the bias control circuit 21.

Since the circuit configuration of the bias control circuit 21 is the same as that of the first embodiment, the description thereof will not be repeated.

In the first embodiment described above, the emitter of the transistor 74a is electrically connected to the collector and the base of the transistor 52. On the other hand, in the seventh embodiment, an emitter of the transistor 74a is electrically connected to a collector and a base of the transistor 53. That is, the transistor 74a outputs the emitter current corresponding to a collector potential (power supply potential Vcc_s) and a potential of the base (control potential Vctrl) as the bias control current Ibst to the collector and the base of the transistor 53.

The bias control current Ibst flows to the first reference potential via the transistor 53. Therefore, potentials of the collector and base of the transistor 53 increase. As a result, potentials of the collector and base of the transistor 52, that is, the potential of the base of the transistor 55, increase. Further, a current flowing through the transistor 52 in the first constant current Ictrl_drv decreases, and a base current of the transistor 55 increases.

As a result, the first bias current Ibb_drv which is the emitter current of the transistor 55 increases. When the first bias current Ibb_drv increases, a gain of the transistor 12a increases.

Conversely, when the bias control current Ibst decreases, the potentials of the collector and base of the transistor 53 decrease. As a result, the potentials of the collector and base of the transistor 52, that is, the potential of the base of the transistor 55, decrease. Further, the current flowing through the transistor 52 in the first constant current Ictrl_drv increases, so that the base current of the transistor 55 decreases.

As a result, the first bias current Ibb_drv which is the emitter current of the transistor 55 decreases. When the first bias current Ibb_drv decreases, the gain of the transistor 12a decreases.

Thus, the seventh embodiment has the same effects as the first embodiment.

Note that the seventh embodiment may be combined with other embodiments. For example, the bias control circuit 21 of the seventh embodiment may include the resistance variation compensation circuit 75 of the bias control circuit 21A (see FIG. 3) of the second embodiment. Further, the bias control circuit 21 of the seventh embodiment may include the potential adjustment circuit 76 of the bias control circuit 21B (see FIG. 4) of the third embodiment. Additionally, the bias control circuit 21 of the seventh embodiment may include the potential output circuit 73C of the bias control circuit 21C (see FIG. 5) of the fourth embodiment instead of the potential output circuit 73.

Further, the bias control circuit 21 of the seventh embodiment may include the current output circuit 70D of the bias control circuit 21D (see FIG. 6) of the fifth embodiment instead of the current output circuit 70. Further, when the current output circuit 70D is included in the bias control circuit 21 of the seventh embodiment, the base of the transistor 72b may be electrically connected to the emitter of the transistor 65, similarly to the sixth embodiment (see FIG. 7).

Eighth Embodiment

Figure 9:
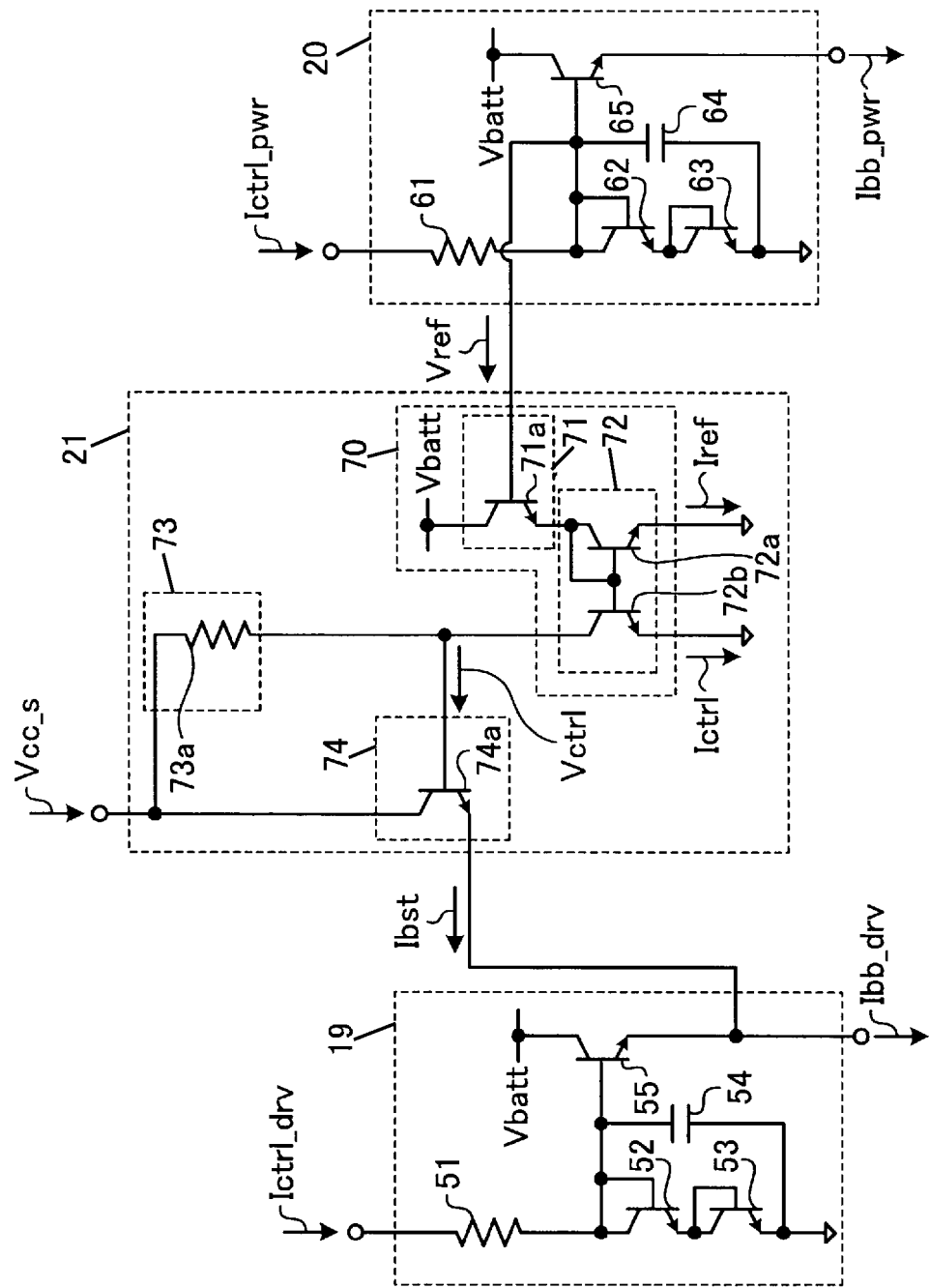
FIG. 9 is a diagram illustrating a circuit configuration of a power amplifier circuit according to an eighth embodiment.

FIG. 9 is a diagram illustrating a circuit configuration of a power amplifier circuit according to an eighth embodiment. Specifically, FIG. 9 is the diagram illustrating the circuit configuration of the first bias circuit 19, the second bias circuit 20, and the bias control circuit 21.

Since the circuit configuration of the bias control circuit 21 is the same as that of the first embodiment, the description thereof will not be repeated.

In the first embodiment, the emitter of the transistor 74a is electrically connected to the collector and the base of the transistor 52. In the seventh embodiment, the emitter of the transistor 74a is electrically connected to the collector and the base of the transistor 53. On the other hand, in the eighth embodiment, the emitter of the transistor 74a is electrically connected to the emitter of the transistor 55. That is, the transistor 74a outputs the emitter current corresponding to the collector potential (power supply potential Vcc_s) and the potential of the base (control potential Vctrl) as the bias control current Ibst to the emitter (the other end of the resistor 14 (see FIG. 1)) of the transistor 55.

The bias control current Ibst flows to the base of the transistor 12a (see FIG. 1) via the resistor 14 (see FIG. 1). That is, the first bias current Ibb_drv which is a base current of the transistor 12a is the sum of the emitter current of the transistor 55 and the emitter current (bias control current Ibst) of the transistor 74a.

When the bias control current Ibst increases, the first bias current Ibb_drv increases, and a gain of the transistor 12a increases.

Conversely, when the bias control current Ibst decreases, the first bias current Ibb_drv decreases, and the gain of the transistor 12a decreases.

Thus, the eighth embodiment has the same effects as the first embodiment.

Note that the eighth embodiment may be combined with other embodiments. For example, the bias control circuit 21 of the eighth embodiment may include the resistance variation compensation circuit 75 of the bias control circuit 21A (see FIG. 3) of the second embodiment. Further, the bias control circuit 21 of the eighth embodiment may include the potential adjustment circuit 76 of the bias control circuit 21B (see FIG. 4) of the third embodiment. Additionally, the bias control circuit 21 of the eighth embodiment may include the potential output circuit 73C of the bias control circuit 21C (see FIG. 5) of the fourth embodiment instead of the potential output circuit 73.

Further, the bias control circuit 21 of the eighth embodiment may include the current output circuit 70D of the bias control circuit 21D (see FIG. 6) of the fifth embodiment instead of the current output circuit 70. Additionally, when the current output circuit 70D is included in the bias control circuit 21 of the eighth embodiment, the base of the transistor 72b may be electrically connected to the emitter of the transistor 65, similarly to the sixth embodiment (see FIG. 7).

Ninth Embodiment

Figure 10:
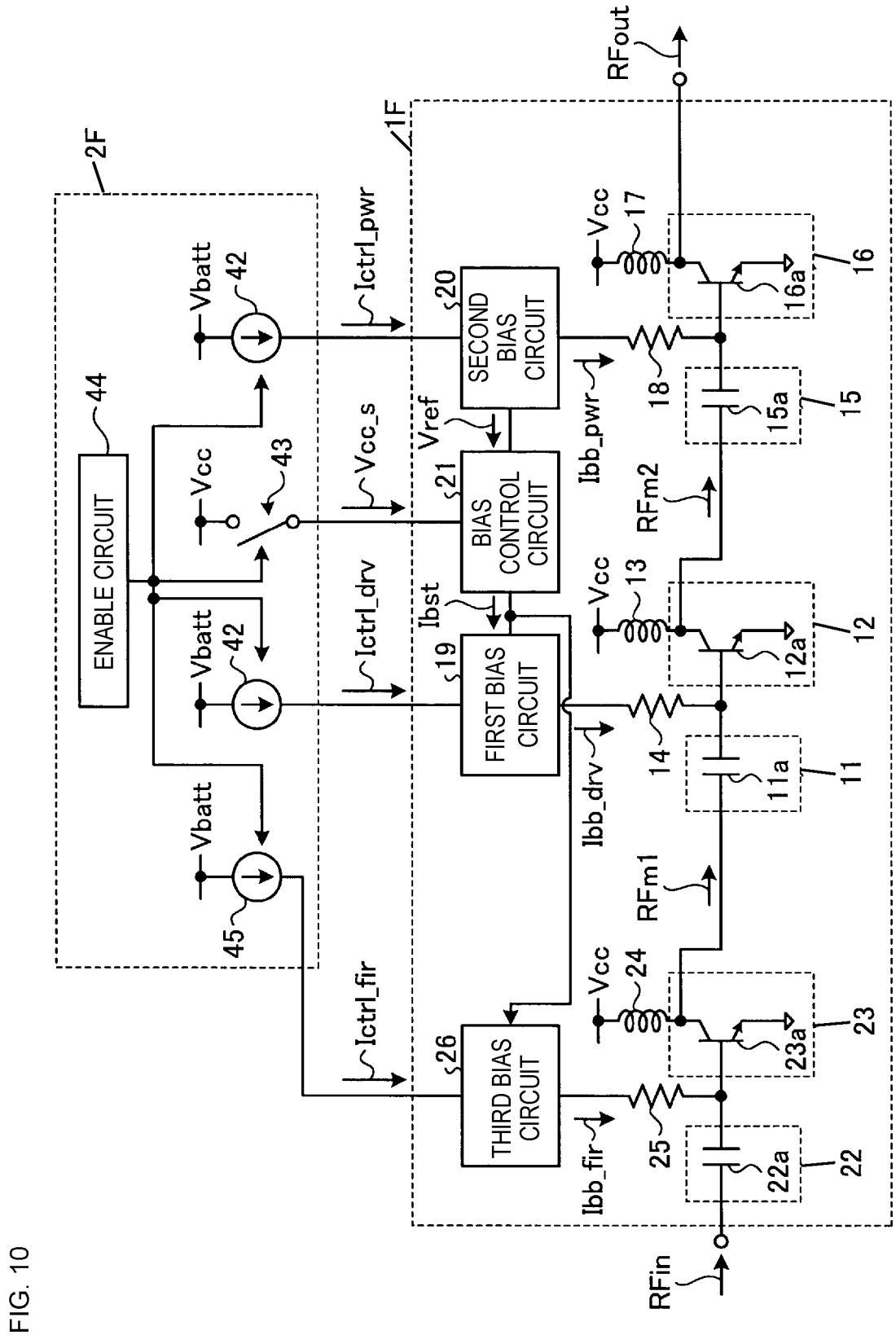
FIG. 10 is a diagram illustrating a circuit configuration of a power amplifier circuit according to a ninth embodiment.

FIG. 10 is a diagram illustrating a circuit configuration of a power amplifier circuit according to a ninth embodiment.

A power amplifier circuit 1F further includes a third matching circuit 22, a third power amplifier 23, an inductor 24, a resistor 25, and a third bias circuit 26, as compared with the power amplifier circuit 1 (see FIG. 1).

In the ninth embodiment, the power amplifier circuit 1F includes three stages of power amplifiers, that is, the third power amplifier 23, the first power amplifier 12, and the second power amplifier 16, but the present disclosure is not limited thereto. The power amplifier circuit 1F may include four or more stages of power amplifiers.

The third power amplifier 23 may be referred to as a first stage. The first power amplifier 12 may be referred to as an intermediate stage or a drive stage. The second power amplifier 16 may be referred to as a final stage or a power stage.

The first power amplifier 12, the resistors 14, 18, and 25, the second power amplifier 16, the first bias circuit 19, the second bias circuit 20, the bias control circuit 21, the third power amplifier 23, and the third bias circuit 26 may be formed on a semiconductor chip (die), but the present disclosure is not limited thereto. The first matching circuit 11, the inductors 13, 17, and 24, the second matching circuit 15, and the third matching circuit 22 may be formed on a substrate on which a semiconductor chip is mounted, but the present disclosure is not limited thereto.

A control circuit 2F further includes a third constant current source 45 as compared with the control circuit 2 (see FIG. 1).

The control circuit 2F may be formed on a semiconductor chip (die) other than a semiconductor chip (die) on which the power amplifier circuit 1F is formed, but the present disclosure is not limited thereto.

The enable circuit 44 controls the power amplifier circuit 1F to perform power amplification (enable) or stop (disable) power amplification. When the power amplifier circuit 1F performs the power amplification, the enable circuit 44 outputs a first level enable signal to operate the first constant current source 41, the second constant current source 42 and the third constant current source 45, and turns on the switch 43. When the enable circuit 44 disables the power amplifier circuit 1F from performing the power amplification, the enable circuit 44 outputs the second level enable signal to stop the first constant current source 41, the second constant current source 42, and the third constant current source 45, and turns off the switch 43.

When the enable signal is at the first level (in operation), the third constant current source 45 outputs a third constant current Ictrl_fir to the third bias circuit 26 by using a DC power of the power supply potential Vbatt. When the enable signal is at the second level (in stop), the third constant current source 45 does not output the third constant current Ictrl_fir to the third bias circuit 26.

The third matching circuit 22 includes a capacitor 22a, but the present disclosure is not limited thereto. The third matching circuit 22 may be configured by appropriately combining a capacitor, an inductor, and the like. The capacitor 22a serves as a DC cut capacitor which blocks a DC component of the high-frequency input signal RFin and allows an AC component to pass.

The third power amplifier 23 includes a transistor 23a. An emitter of the transistor 23a is electrically connected to the first reference potential.

A collector of the transistor 23a is electrically connected to one end of the inductor 24. The other end of the inductor 24 is electrically connected to the power supply potential Vcc. The inductor 24 supplies the DC power of the power supply potential Vcc to the collector of the transistor 23a. A collector current flows from the power supply potential Vcc to the collector of the transistor 23a via the inductor 24.

The inductor 24 has a sufficiently high impedance with respect to the frequency band of the high-frequency input signal RFin. That is, the impedance of the inductor 24 is negligible when considering the frequency band of the high-frequency input signal RFin. Further, the inductor 24 suppresses the coupling of the high-frequency input signal RFin to a power supply circuit. That is, the inductor 24 functions as a choke inductor.

The high-frequency input signal RFin is inputted to a base of the transistor 23a via the capacitor 22a.

The base of the transistor 23a is electrically connected to one end of the resistor 25. The other end of the resistor 25 is electrically connected to the third bias circuit 26.

The third bias circuit 26 outputs a third bias current Ibb_fir corresponding to the third constant current Ictrl_fir to the other end of the resistor 25. The third bias current Ibb_fir is inputted to the base of the transistor 23a via the resistor 25.

An electric bias state of the transistor 23a is set by the third bias current Ibb_fir. The transistor 23a outputs a high-frequency signal RFm1 obtained by power-amplifying the high-frequency input signal RFin from the collector to the first matching circuit 11.

The high-frequency signal RFm1 is inputted to the base of the transistor 12a via the capacitor 11a. The transistor 12a outputs the high-frequency signal RFm1 obtained by power-amplifying a high-frequency signal RFm2 from the collector to the capacitor 15a. The high-frequency signal RFm2 is inputted to the base of the transistor 16a via the capacitor 15a. The transistor 16a outputs the high-frequency output signal RFout obtained by power-amplifying the high-frequency signal RFm2 from the collector.

The bias control circuit 21 receives the second reference potential Vref which is the potential of the portion in the second bias circuit 20 and varies depending on the power of the high-frequency output signal RFout. Then, the bias control circuit 21 outputs the bias control current Ibst for increasing the third bias current Ibb_fir and the first bias current Ibb_drv to the third bias circuit 26 and the first bias circuit 19 based on the second reference potential Vref.

Figure 11:
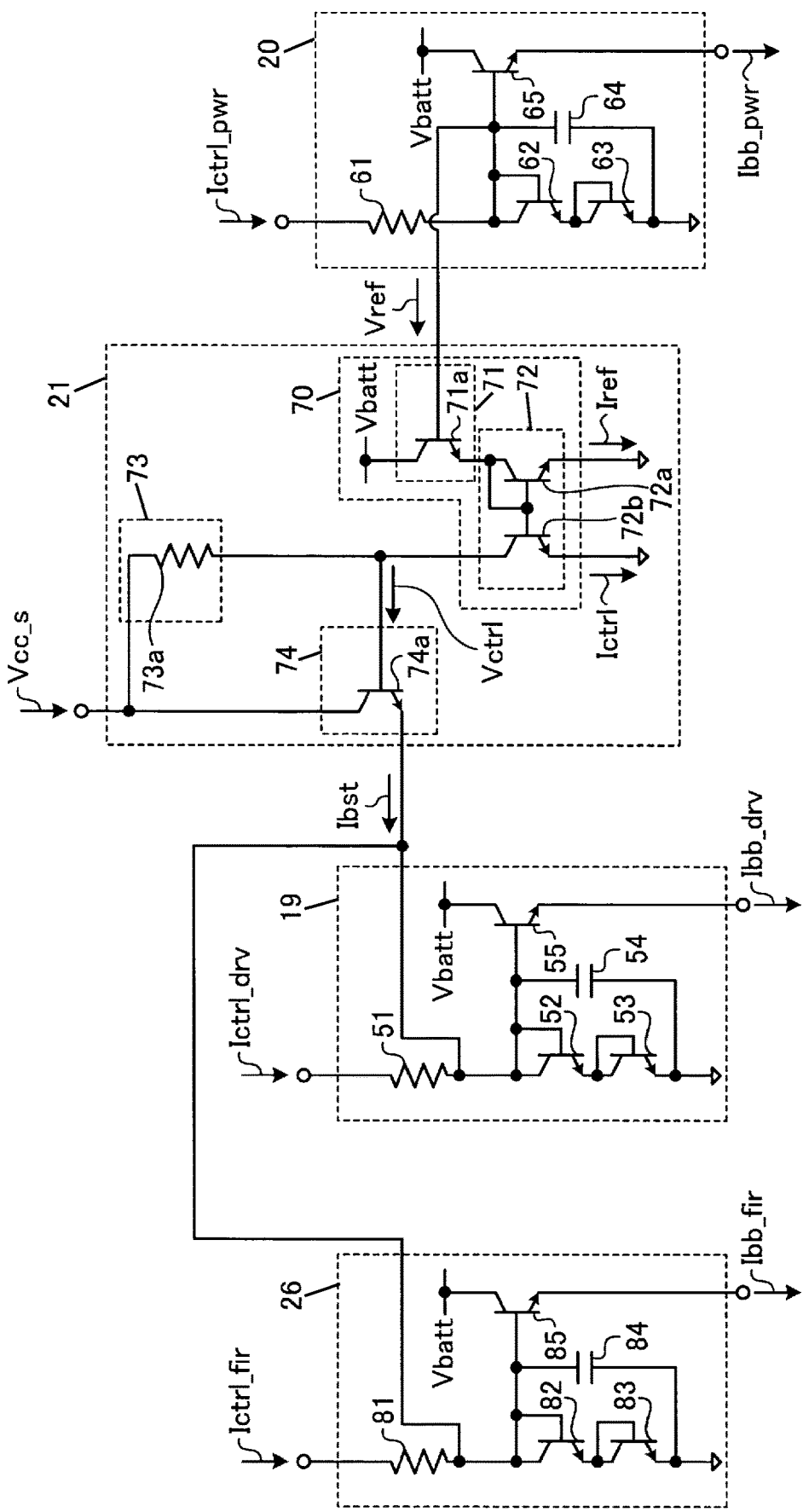
FIG. 11 is a diagram illustrating a circuit configuration of a power amplifier circuit according to the ninth embodiment.

FIG. 11 is a diagram illustrating a circuit configuration of a power amplifier circuit according to a ninth embodiment. Specifically, FIG. 11 is the diagram illustrating the circuit configuration of the third bias circuit 26, the first bias circuit 19, the second bias circuit 20, and the bias control circuit 21.

The third bias circuit 26 includes a resistor 81, transistors 82, 83, and 85, and a capacitor 84.

The third constant current Ictrl_fir is inputted to one end of the resistor 81 from the third constant current source 45 (see FIG. 10).

A collector and a base of the transistor 82 are electrically connected to the other end of the resistor 81. That is, the transistor 82 is diode-connected.

The transistor 82 corresponds to a "twelfth transistor" of the present disclosure.

A collector and a base of the transistor 83 are electrically connected to an emitter of the transistor 82. That is, the transistor 53 is diode-connected. An emitter of the transistor 83 is connected to the first reference potential.

The transistor 83 corresponds to a "thirteenth transistor" of the present disclosure.

The potentials of the collector and base of the transistor 82 correspond to a potential drop of two diodes.

One end of the capacitor 84 is electrically connected to the collector and the base of the transistor 82. The other end of the capacitor 84 is electrically connected to the first reference potential. The capacitor 84 stabilizes the potentials of the collector and base of the transistor 82, and grounds a potential of the base of the transistor 85 in an AC manner.

The power supply potential Vbatt is inputted to a collector of the transistor 85. A base of the transistor 85 is electrically connected to the collector and the base of the transistor 82, and to one end of the capacitor 84.

The transistor 85 corresponds to an "eleventh transistor" of the present disclosure.

Most of the third constant current Ictrl_fir inputted to the resistor 81 flows to the first reference potential via the transistors 82 and 83. The remaining portion of the third constant current Ictrl_fir becomes the base current of the transistor 85.

An emitter of the transistor 85 is electrically connected to the other end of the resistor 25 (see FIG. 10). That is, the transistor 85 is emitter-follower connected. As a result, the potential of the base of the transistor 23a (see FIG. 10) is stabilized. The transistor 85 outputs an emitter current corresponding to the base current to the other end of the resistor 25 (see FIG. 10) as the third bias current Ibb_fir.

In the first embodiment, the emitter of the transistor 74a is electrically connected to the collector and the base of the transistor 52, and to the base of the transistor 55. On the other hand, in the ninth embodiment, the emitter of the transistor 74a is electrically connected to the collector and the base of the transistor 82, to the base of the transistor 85, to the collector and the base of the transistor 52, and to the base of the transistor 55. That is, the transistor 74a outputs an emitter current corresponding to the collector potential (power supply potential Vcc_s) and the potential of the base (control potential Vctrl) as the bias control current Ibst to the collector and the base of the transistor 82, the base of the transistor 85, the collector and the base of the transistor 52 and the base, and the base of the transistor 55.

A portion of the bias control current Ibst flows to the collector and the base of the transistor 82 and to the base of the transistor 85. The remaining portion of the bias control current Ibst flows to the collector and the base of the transistor 52 and to the base of transistor 55.

Note that a size of the transistor 74a in the ninth embodiment is exemplified to be larger than a size of the transistor 74a in the first embodiment in consideration of the fact that the bias control current Ibst flows into two destinations. The size of the transistor 74a in the ninth embodiment is set to be about two times the size of the transistor 74a in the first embodiment, for example. However, the present disclosure is not limited thereto.

When the bias control current Ibst increases, the potential of the base of the transistor 85 (i.e., the potential drops at the transistors 82 and 83) increases, and the base current of the transistor 85 increases. As a result, the third bias current Ibb_fir which is the emitter current of the transistor 85 increases. When the third bias current Ibb_fir increases, a gain of the transistor 23a increases.

That is, when the power of the high-frequency output signal RFout increases, a gain of the transistor 16a decreases, and the bias control current Ibst increases, the gain of the transistor 23a increases.

Similarly, when the bias control current Ibst increases, the potential of the base of the transistor 55 (i.e., the potential drops at the transistors 52 and 53) increases, and the base current of the transistor 55 increases. As a result, the first bias current Ibb_drv which is the emitter current of the transistor 55 increases. When the first bias current Ibb_drv increases, a gain of the transistor 12a increases.

That is, when the power of the high-frequency output signal RFout increases, the gain of the transistor 16a decreases, and the bias control current Ibst increases, the gain of the transistor 12a increases.

Conversely, when the bias control current Ibst decreases, the potential of the base of the transistor 85 (i.e., the potential drops at the transistors 82 and 83) decreases, and the base current of the transistor 85 decreases. Thus, the third bias current Ibb_fir which is the emitter current of the transistor 85 decreases. When the third bias current Ibb_fir decreases, the gain of the transistor 23a decreases.

That is, when the power of the high-frequency output signal RFout decreases, the gain of the transistor 16a increases, and the bias control current Ibst is decreased, the gain of the transistor 23a decreases.

Similarly, when the bias control current Ibst decreases, the potential of the base of the transistor 55 (i.e., the potential drops at the transistors 52 and 53) decreases, and the base current of the transistor 55 decreases. As a result, the first bias current Ibb_drv which is the emitter current of the transistor 55 decreases. When the first bias current Ibb_drv decreases, the gain of the transistor 12a decreases.

That is, when the power of the high-frequency output signal RFout decreases, the gain of the transistor 16a increases, and the bias control current Ibst decreases, the gain of the transistor 12a decreases.

As described above, the power amplifier circuit 1F can compensate for a decrease in a gain of the second power amplifier 16 by an increase in gains of the third power amplifier 23 and the first power amplifier 12. Thereby, the power amplifier circuit 1F can suppress a decrease in a gain in the entire power amplifier circuit 1F.

In addition, the power amplifier circuit 1F can increase the amount of increase in gains of the third power amplifier 23 and the first power amplifier 12 compared with the amount of increase in the gain of the first power amplifier 12 of the power amplifier circuit 1 (see FIG. 1) according to the first embodiment.

Note that the ninth embodiment may be combined with other embodiments. For example, the bias control circuit 21 of the ninth embodiment may include the resistance variation compensation circuit 75 of the bias control circuit 21A (see FIG. 3) of the second embodiment. Further, the bias control circuit 21 of the ninth embodiment may include the potential adjustment circuit 76 of the bias control circuit 21B (see FIG. 4) of the third embodiment. Additionally, the bias control circuit 21 of the ninth embodiment may include the potential output circuit 73C of the bias control circuit 21C (see FIG. 5) of the fourth embodiment instead of the potential output circuit 73.

Further, the bias control circuit 21 of the ninth embodiment may include the current output circuit 70D of the bias control circuit 21D (see FIG. 6) of the fifth embodiment instead of the current output circuit 70. Additionally, when the current output circuit 70D is included in the bias control circuit 21 of the ninth embodiment, the base of the transistor 72b may be electrically connected to the emitter of the transistor 65, similarly to the sixth embodiment (see FIG. 7).

Further, the emitter of the transistor 74a of the bias control circuit 21 according to the ninth embodiment may be electrically connected to the collector and the base of the transistor 83 and the collector and the base of the transistor 53, similarly to the seventh embodiment (see FIG. 8).

In addition, the emitter of the transistor 74a of the bias control circuit 21 according to the ninth embodiment may be electrically connected to the emitter of the transistor 85 and the emitter of the transistor 55, similarly to the eighth embodiment (see FIG. 9).

Tenth Embodiment

Figure 12:
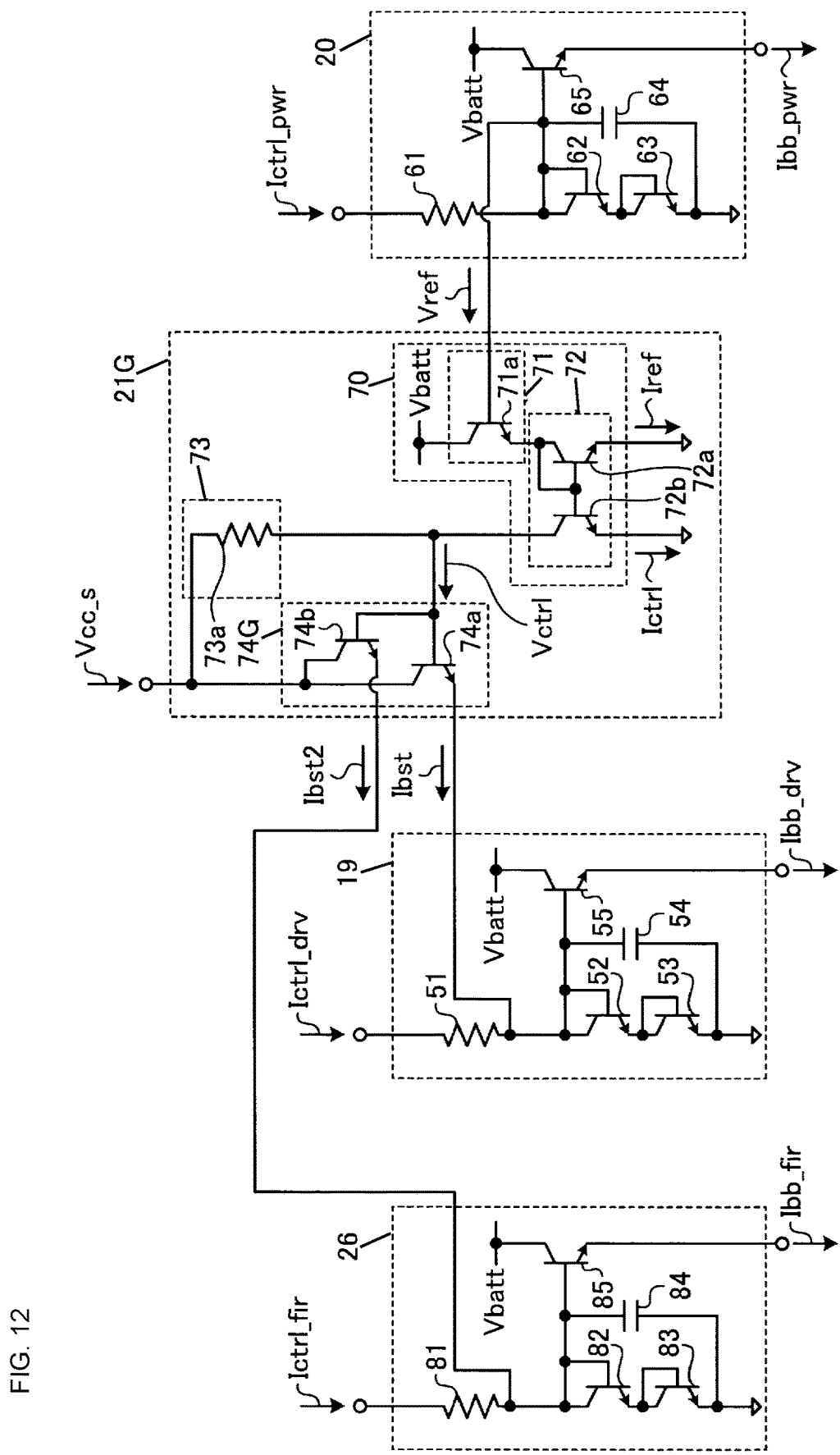
FIG. 12 is a diagram illustrating a circuit configuration of a power amplifier circuit according to a tenth embodiment.

FIG. 12 is a diagram illustrating a circuit configuration of a power amplifier circuit according to a tenth embodiment. Specifically, FIG. 12 is the diagram illustrating the circuit configuration of the third bias circuit 26, the first bias circuit 19, the second bias circuit 20, and a bias control circuit 21G.

Among the constituent elements of the bias control circuit 21G, constituent elements identical to those in the other embodiments are denoted by the same reference numerals, and the description thereof will not be repeated.

The bias control circuit 21G includes a first voltage-current conversion circuit 74G instead of the first voltage-current conversion circuit 74 compared with the bias control circuit 21 (see FIG. 11). The first voltage-current conversion circuit 74G further includes a transistor 74b as compared with the first voltage-current conversion circuit 74.

The transistor 74b corresponds to a "fifteenth transistor" of the present disclosure.

The power supply potential Vcc_s is inputted to a collector of the transistor 74b from the switch 43 (see FIG. 10). A base of the transistor 74b is electrically connected to the other end of the resistor 73a and the collector of the transistor 72b. Thereby, the control potential Vctrl is inputted to the base of the transistor 74b. An emitter which is an output terminal of the transistor 74b is electrically connected to a collector and a base of the transistor 82 and a base of the transistor 85. The transistor 74b outputs an emitter current corresponding to a collector potential (power supply potential Vcc_s) and a potential of the base (control potential Vctrl) as a bias control current Ibst2 to the collector and the base of the transistor 82, and to the base of the transistor 85.

Since the operations of the third bias circuit 26 and the first bias circuit 19 are the same as that of the ninth embodiment, the description thereof will not be repeated.

The bias control circuit 21G can adjust the bias control current Ibst by a size of the transistor 74a and adjust the bias control current Ibst2 by a size of the transistor 74b, as compared with the bias control circuit 21. That is, the bias control circuit 21G can individually adjust the bias control current Ibst and the bias control current Ibst2. Thereby, the bias control circuit 21G can adjust the amount of increase in a gain in the third power amplifier 23 and the amount of increase in a gain in the first power amplifier 12 with high accuracy.

Note that the tenth embodiment may be combined with other embodiments. For example, the bias control circuit 21G of the tenth embodiment may include the resistance variation compensation circuit 75 of the bias control circuit 21A (see FIG. 3) of the second embodiment. Further, the bias control circuit 21G of the tenth embodiment may include the potential adjustment circuit 76 of the bias control circuit 21B (see FIG. 4) of the third embodiment. Additionally, the bias control circuit 21G of the tenth embodiment may include a potential output circuit 73C of the bias control circuit 21C (see FIG. 5) of the fourth embodiment instead of the potential output circuit 73.

Additionally, the bias control circuit 21G of the tenth embodiment may include the current output circuit 70D of the bias control circuit 21D (see FIG. 6) of the fifth embodiment instead of the current output circuit 70. Additionally, when the current output circuit 70D is included in the bias control circuit 21G of the tenth embodiment, a base of the transistor 72b may be electrically connected to an emitter of the transistor 65, similarly to the sixth embodiment (see FIG. 7).

Further, an emitter of the transistor 53a of the bias control circuit 21G of the tenth embodiment may be electrically connected to a collector and a base of the transistor 74a, similarly to the seventh embodiment (see FIG. 8). Similarly, an emitter of transistor 74b may be electrically connected to a collector and a base of the transistor 83.

Further, an emitter of the transistor 55a of the bias control circuit 21G of the tenth embodiment may be electrically connected to the emitter of the transistor 74a, similarly to the eighth embodiment (see FIG. 9). Similarly, an emitter of the transistor 74b may be electrically connected to an emitter of transistor 85.

Eleventh Embodiment

Figure 13:
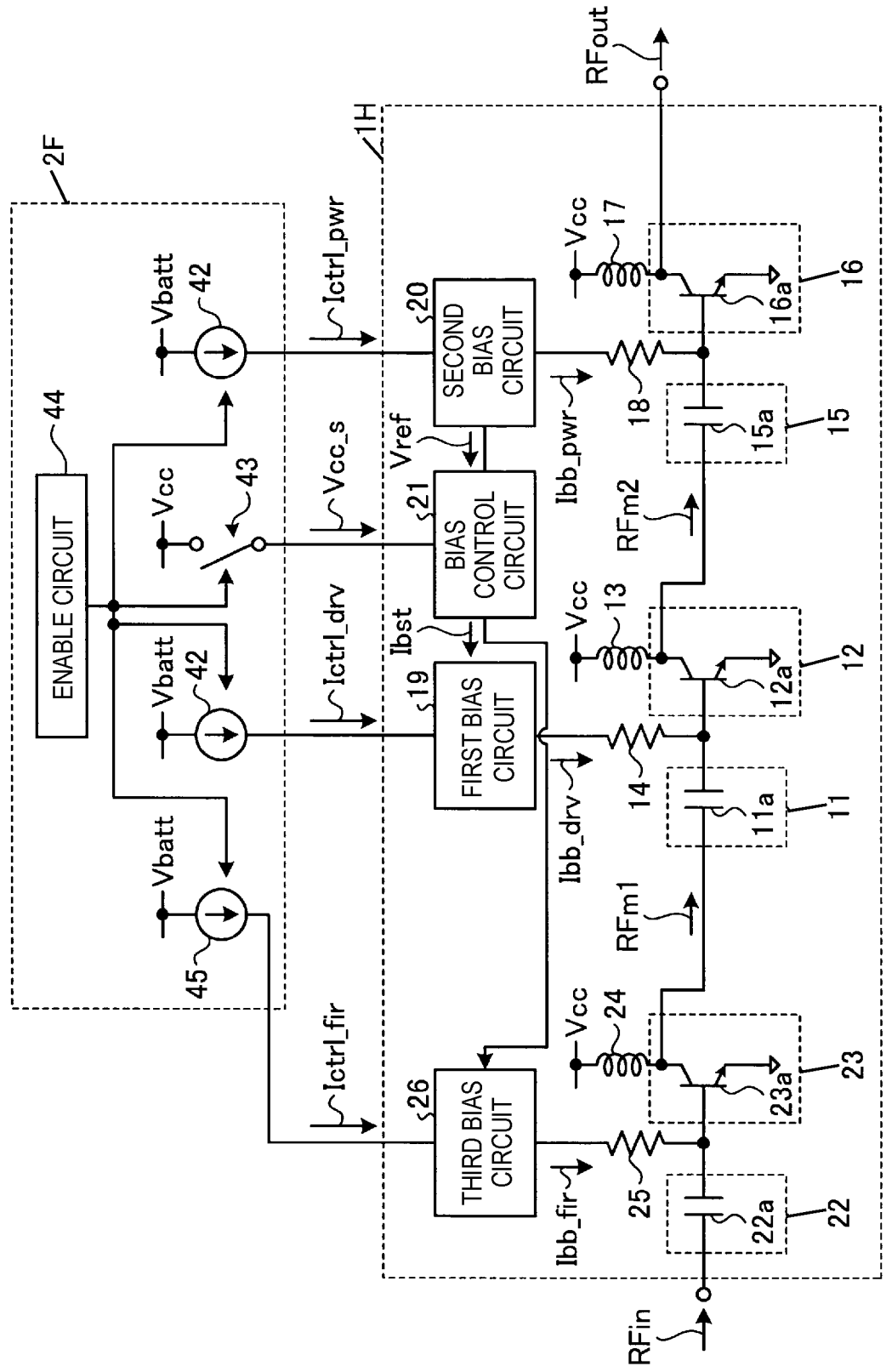
FIG. 13 is a diagram illustrating a circuit configuration of a power amplifier circuit according to an eleventh embodiment.

FIG. 13 is a diagram illustrating a circuit configuration of a power amplifier circuit according to an eleventh embodiment.

Among the constituent elements of a power amplifier circuit 1H, constituent elements identical to those in the other embodiments are denoted by the same reference numerals, and the description thereof will not be repeated.

In the power amplifier circuit 1H, the bias control circuit 21 outputs the bias control current Ibst only to the third bias circuit 26 as compared with the power amplifying circuit 1F of the ninth embodiment (see FIG. 10). That is, the bias control circuit 21 does not output the bias control current Ibst to the first bias circuit 19.

Figure 14:
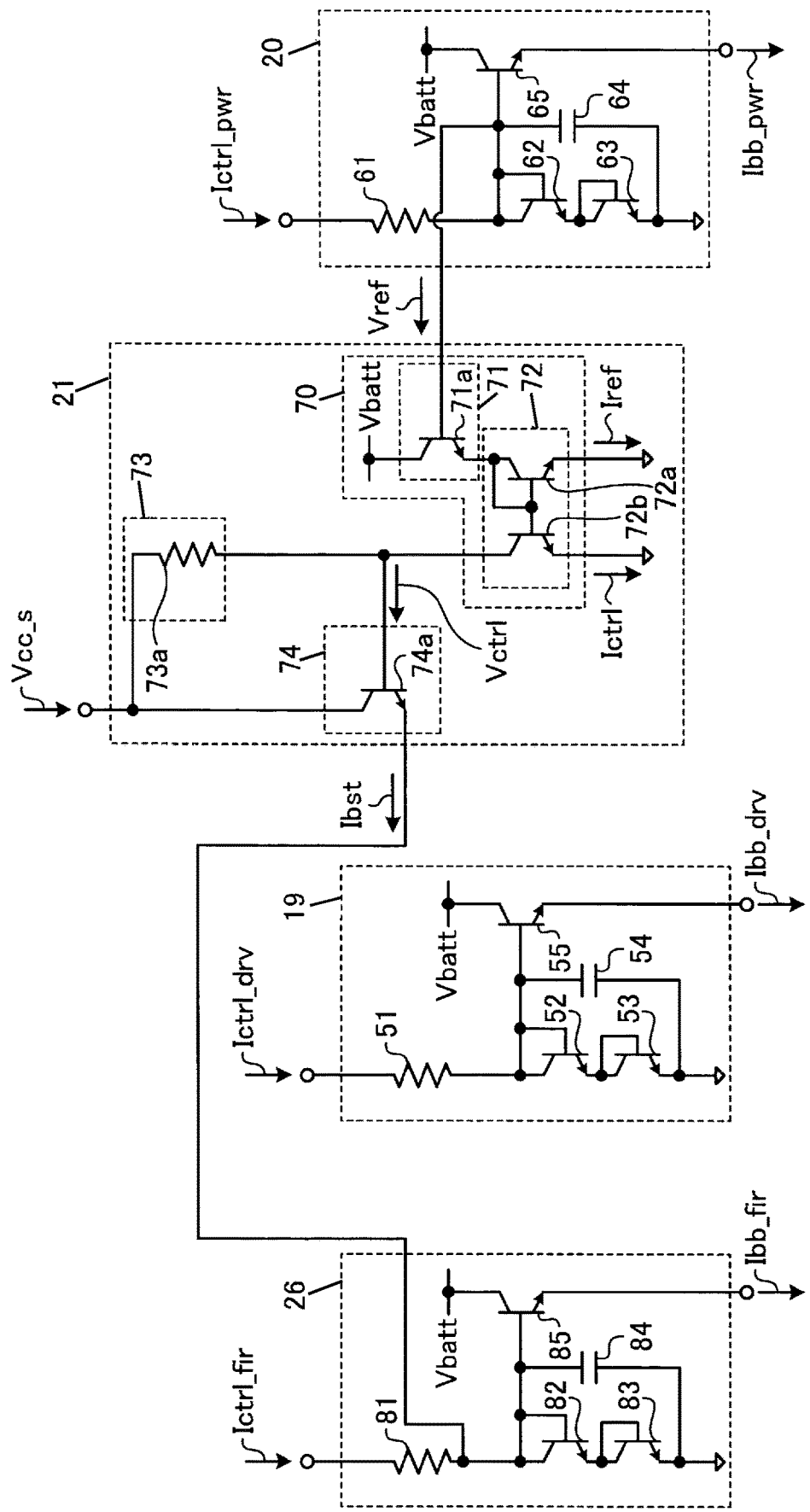
FIG. 14 is a diagram illustrating a circuit configuration of a power amplifier circuit according to the eleventh embodiment.

FIG. 14 is a diagram illustrating a circuit configuration of the power amplifier circuit according to the eleventh embodiment. Specifically, FIG. 14 is the diagram illustrating the circuit configuration of the third bias circuit 26, the first bias circuit 19, the second bias circuit 20, and the bias control circuit 21.

An emitter of transistor 74a is electrically connected to a collector and a base of the transistor 82, and to a base of the transistor 85. Thereby, the bias control current Ibst is inputted to the collector and the base of the transistor 82 and the base of the transistor 85.

Since the operation of the third bias circuit 26 is the same as that of the ninth embodiment, a description thereof will not be repeated.

The third power amplifier 23 which is a first stage is smaller in size than the first power amplifier 12 which is an intermediate stage or a driver stage. Therefore, the power amplifier circuit 1H of the eleventh embodiment can realize the same effects as those of the other embodiments with low power consumption.

Note that the eleventh embodiment may be combined with other embodiments. For example, the bias control circuit 21 of the eleventh embodiment may include the resistance variation compensation circuit 75 of the bias control circuit 21A (see FIG. 3) of the second embodiment. Further, the bias control circuit 21 of the eleventh embodiment may include the potential adjustment circuit 76 of the bias control circuit 21B (see FIG. 4) of the third embodiment. Additionally, the bias control circuit 21 of the eleventh embodiment may include the potential output circuit 73C of the bias control circuit 21C (see FIG. 5) of the fourth embodiment instead of the potential output circuit 73.

Further, the bias control circuit 21 of the eleventh embodiment may include the current output circuit 70D of the bias control circuit 21D (see FIG. 6) of the fifth embodiment instead of the current output circuit 70. Additionally, when the current output circuit 70D is included in the bias control circuit 21 of the eleventh embodiment, a base of the transistor 72b may be electrically connected to an emitter of the transistor 65, similarly to the sixth embodiment (see FIG. 7).

Further, an emitter of the transistor 83a of the bias control circuit 21 of the eleventh embodiment may be electrically connected to a collector and a base of the transistor 74a, similarly to the seventh embodiment (see FIG. 8).

Additionally, an emitter of the transistor 85a of the bias control circuit 21 of the eleventh embodiment may be electrically connected to an emitter of the transistor 74a, similarly to the eighth embodiment (see FIG. 9).

Note that the above-described embodiments are intended to facilitate the understanding of the present disclosure, and are not intended to limit the present disclosure. The present disclosure may be modified and/or improved without departing from the spirit and scope thereof, and the present disclosure also includes equivalents thereof.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a plurality of power amplifiers connected in a plurality of stages, the plurality of power amplifiers being configured to amplify a high-frequency input signal and to output an amplified high-frequency output signal;
a plurality of bias circuits, each of the plurality of bias circuits being configured to output a bias current to a corresponding one of the plurality of power amplifiers;
a bias control circuit configured to output a bias control current based on a second reference potential, wherein:
the second reference potential varies in response to a power of the high-frequency output signal, and is a potential in a later stage bias circuit of the plurality of bias circuits,
the bias control current is output to one or more earlier stage bias circuits that precede the later stage bias circuit, and
the bias control current is configured to increase the bias current output from the one or more earlier stage bias circuits,
wherein the second reference potential is a base voltage or emitter voltage of a fourth transistor, the fourth transistor being part of the later stage bias circuit and having an emitter from which the bias current of the later stage bias circuit is output.

2. The power amplifier circuit according to claim 1, wherein the bias control circuit comprises:
a first circuit configured to output a control current based on the second reference potential;
a second circuit configured to output a control potential based on the control current; and
a third circuit configured to output the bias control current based on the control potential.

3. The power amplifier circuit according to claim 2, wherein the first circuit comprises:
a first transistor having a collector to which a first power supply potential is input and a base to which the second reference potential is input;
a second transistor having a collector and a base electrically connected to an emitter of the first transistor, and having an emitter electrically connected to a first reference potential; and
a third transistor having a base electrically connected to the base of the second transistor, an emitter electrically connected to the first reference potential, and a collector electrically connected to the second circuit, the third transistor being configured to output the control current.

4. The power amplifier circuit according to claim 2, wherein the first circuit comprises:
a third transistor having a base to which the second reference potential is input, an emitter electrically connected to a first reference potential, and a collector electrically connected to the second circuit, the third transistor being configured to output the control current.

5. The power amplifier circuit according to claim 4, wherein the later stage bias circuit comprises:
the fourth transistor having a collector to which a first power supply potential is input, a base to which a constant current is input, and the emitter from which the bias current is output;
a fifth transistor having a collector and a base electrically connected to the base of the fourth transistor; and
a sixth transistor having a collector and a base electrically connected to an emitter of the fifth transistor, and having an emitter electrically connected to the first reference potential, and
wherein the base of the third transistor is electrically connected to the collector and the base of the sixth transistor.

6. The power amplifier circuit according to claim 4, wherein the later stage bias circuit comprises:
the fourth transistor having a collector to which a first power supply potential is input, a base to which a constant current is input, and the emitter from which the bias current is output;
a fifth transistor having a collector and a base electrically connected to the base of the fourth transistor; and
a sixth transistor having a collector and a base electrically connected to an emitter of the fifth transistor, and having an emitter electrically connected to the first reference potential, and
wherein the base of the third transistor is electrically connected to the emitter of the fourth transistor.

7. The power amplifier circuit according to claim 2, wherein the bias control circuit further comprises:
a fourth circuit electrically connected between the first circuit and a first reference potential, the fourth circuit being configured to cause a potential drop across the fourth circuit that corresponds to the control current.

8. The power amplifier circuit according to claim 2, wherein the bias control circuit further comprises:
a fifth circuit electrically connected between the first circuit and the second circuit, the fifth circuit being configured to cause a potential drop across the fifth circuit that corresponds to the control current.

9. The power amplifier circuit according to claim 2, wherein the second circuit comprises:
a first resistor, a second power supply potential being input to a first end of the first resistor,
a second resistor having a first end electrically connected to a second end of the first resistor,
a third resistor having a first end electrically connected to a second end of the second resistor, and
a seventh transistor having a collector electrically connected to the second end of the first resistor and to the first end of the second resistor, a base electrically connected to the second end of the second resistor and to the first end of the third resistor, and an emitter electrically connected to a second end of the third resistor.

10. The power amplifier circuit according to claim 2, wherein one of the earlier stage bias circuits comprises:
an eighth transistor having a collector to which a first power supply potential is input, a base to which a constant current is input, and an emitter from which a bias current is output;
a ninth transistor having a collector and a base electrically connected to the base of the eighth transistor; and
a tenth transistor having a collector and a base electrically connected to an emitter of the ninth transistor, and having an emitter electrically connected to a first reference potential, and
wherein an output of the third circuit is electrically connected to the base of the eighth transistor, and to the collector and the base of the ninth transistor.

11. The power amplifier circuit according to claim 2, wherein one of the earlier stage bias circuits comprises:
an eighth transistor having a collector to which a first power supply potential is input, a base to which a constant current is input, and an emitter from which a bias current is output;
a ninth transistor having a collector and a base electrically connected to the base of the eighth transistor; and
a tenth transistor having a collector and a base electrically connected to an emitter of the ninth transistor, and having an emitter electrically connected to a first reference potential, and
wherein an output of the third circuit is electrically connected to the collector and the base of the tenth transistor.

12. The power amplifier circuit according to claim 2, wherein one of the earlier stage bias circuits comprises:
an eighth transistor having a collector to which a first power supply potential is input, a base to which a constant current is input, and an emitter from which a bias current is output;
a ninth transistor having a collector and a base electrically connected to the base of the eighth transistor;
a tenth transistor having a collector and a base electrically connected to an emitter of the ninth transistor, and having an emitter electrically connected to a first reference potential, and
wherein an output of the third circuit is electrically connected to the emitter of the eighth transistor.

13. The power amplifier circuit according to claim 2, wherein one of the earlier stage bias circuits comprises:
an eighth transistor having a collector to which a first power supply potential is input, a base to which a constant current is input, and an emitter from which a bias current is output;
a ninth transistor having a collector and a base electrically connected to the base of the eighth transistor; and
a tenth transistor having a collector and a base electrically connected to an emitter of the ninth transistor, and having an emitter electrically connected to a first reference potential, and
wherein another one of the earlier stage bias circuits comprises:
an eleventh transistor having a collector to which the first power supply potential is input, a base to which another constant current is input, and an emitter from which another bias current is output;
a twelfth transistor having a collector and a base electrically connected to the base of the eleventh transistor; and
a thirteenth transistor having a collector and a base electrically connected to an emitter of the twelfth transistor, and having an emitter electrically connected to the first reference potential, and
wherein an output of the third circuit is electrically connected to the base of the eighth transistor and to the base of the eleventh transistor.

14. The power amplifier circuit according to claim 13, wherein the third circuit comprises:
a fourteenth transistor having a collector to which a second power supply potential is input, and a base to which the control potential is input; and
a fifteenth transistor having a collector to which the second power supply potential is input, and a base to which the control potential is input, and
wherein:
an emitter of the fourteenth transistor is electrically connected to the base of the eighth transistor, and
an emitter of the fifteenth transistor is electrically connected to the base of the eleventh transistor.

15. The power amplifier circuit according to claim 2, wherein one of the earlier stage bias circuits is two stages prior to the later bias circuit and comprises:
an eleventh transistor having a collector to which a first power supply potential is input, a base to which a constant current is input, and an emitter from which a bias current is output,
a twelfth transistor having a collector and a base electrically connected to the base of the eleventh transistor,
a thirteenth transistor having a collector and a base electrically connected to an emitter of the twelfth transistor, and having an emitter electrically connected to a first reference potential, and wherein an output of the third circuit is electrically connected to the base of the eleventh transistor.

16. A bias control circuit configured to output a bias control current based on a second reference potential, the bias control circuit comprising:
 a first circuit configured to output a control current based on the second reference potential;
 a second circuit configured to output a control potential based on the control current;
 a third circuit configured to output the bias control current based on the control potential, wherein:
 the bias control circuit is configured to control bias currents output by a plurality of bias circuits, each of the plurality of bias circuits corresponding one of a plurality of power amplifiers in different stages configured to output an amplified high-frequency output signal,
 the second reference potential varies in response to a power of the high-frequency output signal, and is a potential in a later stage bias circuit of the plurality of bias circuits,
 the second reference potential is a base voltage or emitter voltage of a fourth transistor, the fourth transistor being part of the later stage bias circuit and having an emitter from which the bias current of the later stage bias circuit is output,
 the bias control current is output to one or more earlier stage bias circuits that precede the later stage bias circuit, and
 the bias control current is configured to increase a bias current output from the one or more earlier stage bias circuits.

* * * * *